US010126766B2

(12) United States Patent
Cho et al.

(10) Patent No.: US 10,126,766 B2
(45) Date of Patent: Nov. 13, 2018

(54) LOW DROPOUT VOLTAGE (LDO) REGULATOR INCLUDING A DUAL LOOP CIRCUIT AND AN APPLICATION PROCESSOR AND A USER DEVICE INCLUDING THE SAME

(71) Applicant: SAMSUNG ELECTRONICS CO., LTD., Suwon-si, Gyeonggi-Do (KR)

(72) Inventors: Gyu-Hyeong Cho, Daejeon (KR); Yongjin Lee, Goyang-si (KR); Dae-Yong Kim, Seoul (KR); Sangho Kim, Suwon-si (KR)

(73) Assignees: Samsung Electronics Co., Ltd., Suwon-Si, Gyeonggi-Do (KR); Korea Advanced Institute of Science and Technology, Yuseong-Gu, Daejeon (KR)

( * ) Notice: Subject to any disclaimer, the term of this patent is extended or adjusted under 35 U.S.C. 154(b) by 32 days.

(21) Appl. No.: 15/216,147

(22) Filed: Jul. 21, 2016

(65) Prior Publication Data

US 2017/0212540 A1 Jul. 27, 2017

(30) Foreign Application Priority Data

Jan. 26, 2016 (KR) .................. 10-2016-0009478
Jul. 21, 2016 (KR) .................. 10-2016-0092726

(51) Int. Cl.
*G05F 1/10* (2006.01)
*G05F 3/02* (2006.01)
(Continued)

(52) U.S. Cl.
CPC ............. *G05F 1/56* (2013.01); *H03K 5/1534* (2013.01); *H03K 21/026* (2013.01)

(58) Field of Classification Search
CPC ... G05F 1/46; G05F 1/56; G05F 1/563; G05F 1/565; G05F 1/575; G05F 1/59;
(Continued)

(56) References Cited

U.S. PATENT DOCUMENTS 5,302,869 A * 4/1994 Hosotani ............... H03K 5/249
327/74
6,999,019 B2 * 2/2006 Cosand ............... H03M 1/145
341/122
(Continued)

FOREIGN PATENT DOCUMENTS

KR 101198852 11/2012
KR 101428941 8/2014

OTHER PUBLICATIONS

Lee, Yong-Jin, et al. "A 200mA Digital Low-Drop-Out Regulator with Coarse-Fine Dual Loop in Mobile Application Processors", Kaist, Daejeon, Korea, Samsung Electronics, Hwaseong, Korea, 2016 IEEE International Solid-State Conference, pp. 150-152.

*Primary Examiner* — Lincoln Donovan
*Assistant Examiner* — Diana J Cheng
(74) *Attorney, Agent, or Firm* — F. Chau & Associates, LLC

(57) ABSTRACT

A low dropout voltage (LDO) regulator including: a coarse loop circuit configured to receive an input voltage, generate a coarse code and adjust a coarse current according to the coarse code; a digital controller configured to receive the coarse code and generate a fine loop control signal according to the coarse code; and a fine loop circuit configured to receive the input voltage and the fine loop control signal and adjust a fine current according to the input voltage and the fine loop control signal, wherein the coarse current and the fine current adjust a level of an output voltage.

28 Claims, 17 Drawing Sheets

(51) Int. Cl.
*G05F 1/56* (2006.01)
*H03K 5/1534* (2006.01)
*H03K 21/02* (2006.01)

(58) Field of Classification Search
CPC ...... G05F 1/595; H03K 5/153; H03K 5/1534; H03K 21/00; H03K 21/02; H03K 21/026
USPC ................................ 327/538, 540, 541, 543
See application file for complete search history.

(56) References Cited

U.S. PATENT DOCUMENTS

| | | | |
|---|---|---|---|
| 7,821,344 B2* | 10/2010 | Kitayama | H03L 1/026 |
| | | | 327/156 |
| 8,022,681 B2 | 9/2011 | Gurcan | |
| 8,159,201 B2 | 4/2012 | Lin et al. | |
| 9,069,370 B2 | 6/2015 | Soenen et al. | |
| 9,201,435 B2* | 12/2015 | Hammerschmidt | G05F 1/10 |
| 2006/0022753 A1* | 2/2006 | Bonaccio | H03F 3/45183 |
| | | | 330/258 |
| 2011/0248688 A1 | 10/2011 | Iacob et al. | |
| 2014/0070879 A1 | 3/2014 | Kawasaki | |
| 2014/0223205 A1 | 8/2014 | Muthukaruppan et al. | |
| 2014/0277812 A1 | 9/2014 | Shih et al. | |

* cited by examiner

FIG. 8

| Verr | C_LPT[5] | C_LPT[4] | C_LPT[3] | C_LPT[2] | C_LPT[1] |
|---|---|---|---|---|---|
| 72mV | 1 | 1 | 1 | 1 | 1 |
| 36mV | 1 | 1 | 1 | 1 | 0 |
| 0 | 1 | 1 | 1 | 0 | 0 |
| -36mV | 1 | 1 | 0 | 0 | 0 |
| -72mV | 1 | 0 | 0 | 0 | 0 |
|  | 0 | 0 | 0 | 0 | 0 |

FIG. 9

| SEL=0 | CLK |
|---|---|
| Shift | t |
| Left | t+1 |

| C_SPT[1] | C_SPT[2] | C_SPT[3] | ... | C_SPT[18] | C_SPT[19] | C_SPT[20] |
|---|---|---|---|---|---|---|
| 0 | 0 | 0 | ... | 0 | 0 | 1 |
| 0 | 0 | 0 | ... | 0 | 1 | 1 |

| SEL=1 | CLK |
|---|---|
| Shift | t |
| Right | t+1 |

| C_SPT[1] | C_SPT[2] | C_SPT[3] | ... | C_SPT[18] | C_SPT[19] | C_SPT[20] |
|---|---|---|---|---|---|---|
| 0 | 1 | 1 | ... | 1 | 1 | 1 |
| 0 | 0 | 1 | ... | 1 | 1 | 1 |

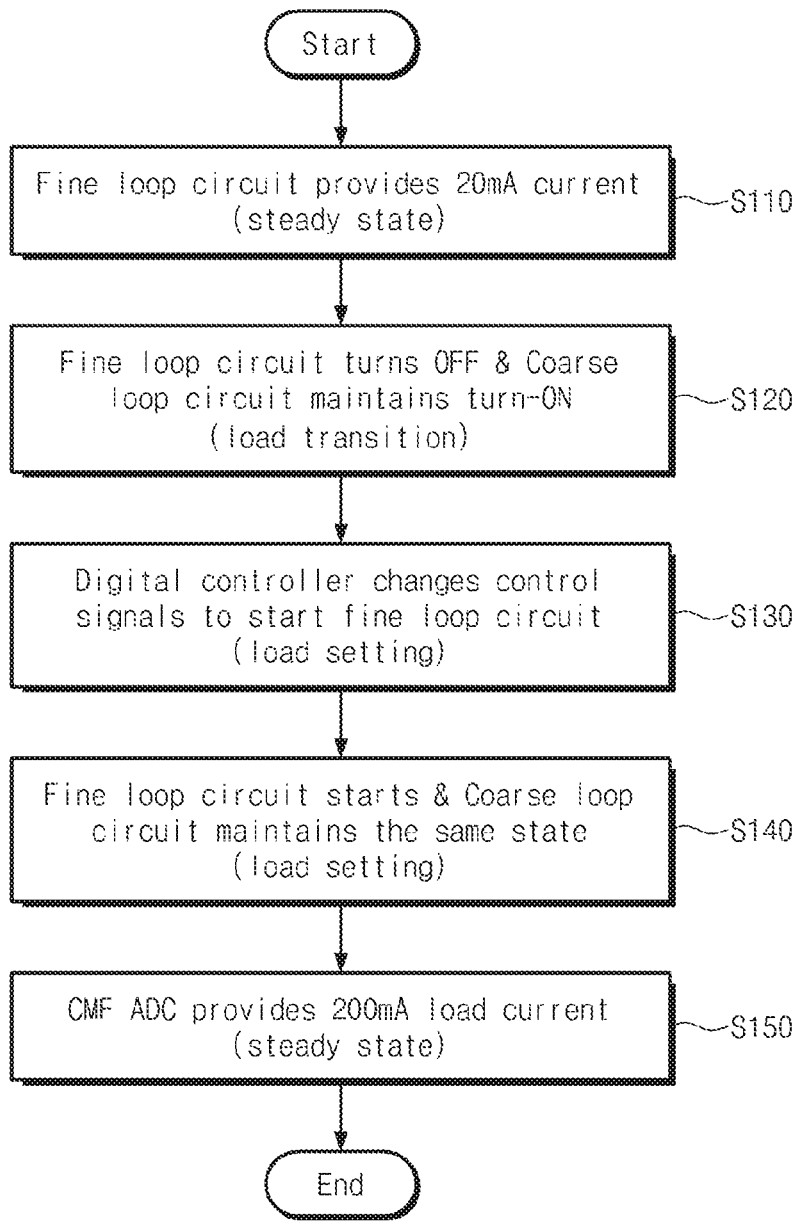

LOW DROPOUT VOLTAGE (LDO) REGULATOR INCLUDING A DUAL LOOP CIRCUIT AND AN APPLICATION PROCESSOR AND A USER DEVICE INCLUDING THE SAME

CROSS-REFERENCE TO RELATED APPLICATIONS

This application claims priority under 35 U.S.C. § 119 to Korean Patent Application No. 10-2016-0009478 filed Jan. 26, 2016, in the Korean Intellectual Property Office and Korean Patent Application No. 10-2016-0092726 filed Jul. 21, 2016, in the Korean Intellectual Property Office, the disclosures of which are incorporated by reference herein in their entireties.

TECHNICAL FIELD

Exemplary embodiments of the inventive concept relate to a voltage regulator, and more particularly, to a low dropout voltage (LDO) regulator including a coarse loop circuit and a fine loop circuit.

DISCUSSION OF RELATED ART

A voltage regulator is used to provide a fixed voltage to a circuit. In other words, a constant voltage level. The voltage regulator may be a linear regulator or a switching regulator depending on the method used for voltage adjustment. The switching regulator is efficient, but has a poor noise characteristic. In contrast, the linear regulator is inefficient, but has a good noise characteristic. Since the noise characteristic of the linear regulator is good, the linear regulator can supply an accurate and stable voltage.

A low dropout voltage (LDO) regulator is a type of linear regulator. The LDO regulator can be used to stably supply power to various types of electronic devices. For example, the LDO regulator may be used in a power management integrated circuit (PMIC) of a mobile device such as a smartphone or a tablet personal computer (PC).

The PMIC of a mobile device may provide various power supply voltages to a semiconductor circuit, such as an application processor or a memory, by using the LDO regulator. A PMIC may provide various power supply voltages through a plurality of power lines. When a plurality of power lines are used between the PMIC and a semiconductor circuit, parasitic resistances or parasitic inductances thereof may destabilize the voltages provided through the lines.

SUMMARY

According to an exemplary embodiment of the inventive concept there is provided a low dropout voltage (LDO) regulator comprising: a coarse loop circuit configured to receive an input voltage, generate a coarse code and adjust a coarse current according to the coarse code; a digital controller configured to receive the coarse code and generate a fine loop control signal according to the coarse code; and a fine loop circuit configured to receive the input voltage and the fine loop control signal and adjust a fine current according to the input voltage and the fine loop control signal, wherein the coarse current and the fine current adjust a level of an output voltage.

According to an exemplary embodiment of the inventive concept there is provided an LDO regulator comprising: an output voltage node; a voltage divider connected to the output voltage node and configured to receive an output voltage that is adjusted in response to a fine current and a coarse current, and to divide the output voltage to generate an input voltage; a coarse loop circuit configured to generate a coarse code in response to the input voltage and generate the coarse current in response to the coarse code; a fine loop circuit configured to generate a fine code in response to the input voltage and a plurality of fine control signals and to generate the fine current in response to the fine code; and a digital controller configured to generate the plurality of control fine control signals in response to the coarse code.

According to an exemplary embodiment of the inventive concept there is provided an LDO regulator comprising: a fine loop circuit configured to provide a fine loop current to an output voltage node and to be disabled in response to a disable signal when an output voltage at the output voltage node changes; a coarse loop circuit configured to provide a varied coarse current in response to a toggling coarse code bit when the fine loop circuit is disabled; and a digital controller configured to generate an initialization signal to set an initial fine current at a first level while the coarse current is being varied and to provide an enable signal to the fine loop circuit to activate the fine loop circuit when the coarse current enters a steady state.

BRIEF DESCRIPTION OF THE DRAWINGS

The above and other features of the inventive concept will become more apparent by describing in detail exemplary embodiments thereof with reference to the accompanying drawings in which:

FIG. 8 is a table for describing the ADC illustrated in FIG. 7A according to an exemplary embodiment of the inventive concept;

FIG. 9 is a table for describing an operation method of a shift register illustrated in FIG. 4 according to an exemplary embodiment of the inventive concept;

FIG. 15 is a flowchart for describing an operation method of the LDO regulator of FIG. 14A according to an exemplary embodiment of the inventive concept.

DETAILED DESCRIPTION OF THE EMBODIMENTS

Figure 1:
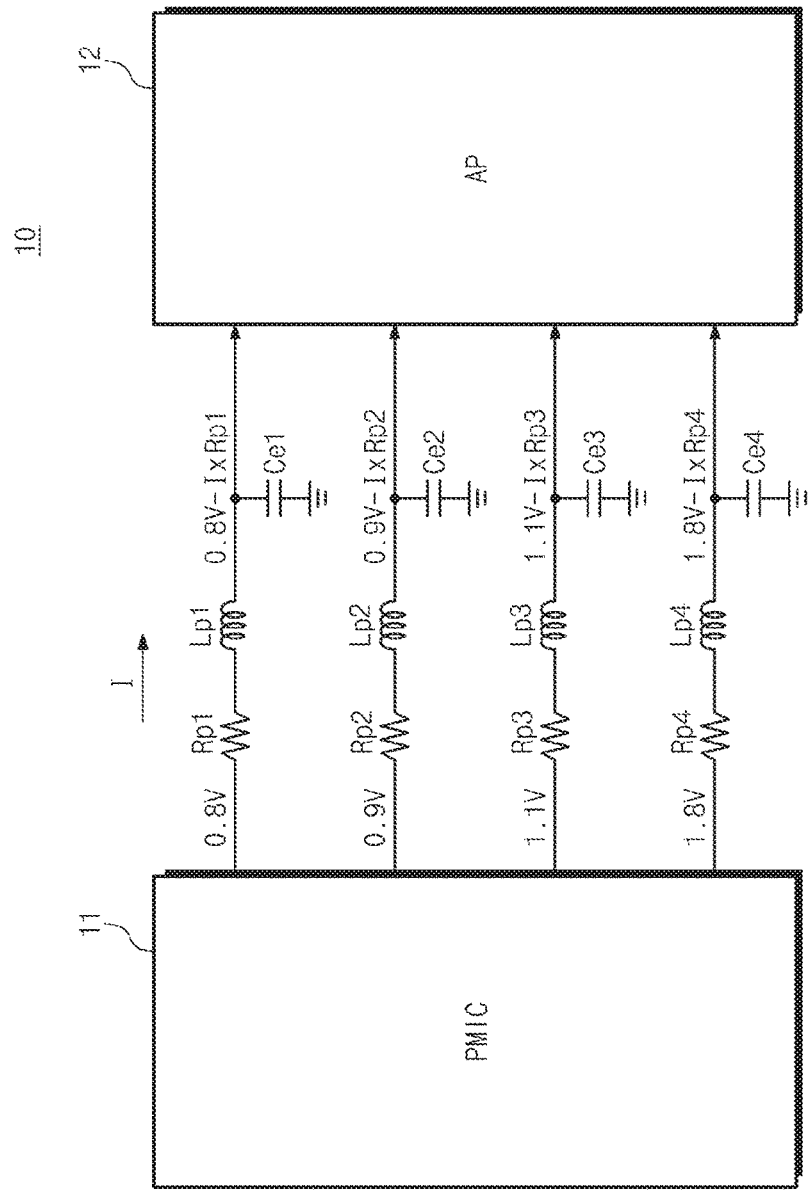
FIG. 1 is a block diagram illustrating a user device.

FIG. 1 is a block diagram illustrating a user device. Referring to FIG. 1, a user device 10 may include a power management integrated circuit (PMIC) 11 and an application processor 12. The user device 10 may be a high-end mobile device such as a smartphone or a tablet personal computer (PC). The performance of the high-end mobile device may depend on the application processor 12. To increase performance within a small area, the application processor 12 may employ a fine process and a complicated design.

The application processor 12 may use various levels of power supply voltages to drive various internal circuits. The power supply voltages may be supplied from the power management integrated circuit 11. As illustrated in FIG. 1, the power management integrated circuit 11 may provide the application processor 12 with various power supply voltages, such as 0.8 V, 0.9 V, 1.1 V, and 1.8 V, through a plurality of power lines.

Referring to FIG. 1, the application processor 12 is connected with the power management integrated circuit 11 through several power lines. A current I flows through each power line, and the power lines may have parasitic resistances Rp1 to Rp4 as well as parasitic inductances Lp1 to Lp4. A direct current (DC) value of a power supply voltage may vary due to the parasitic resistances Rp1 to Rp4 on its line. For example, assume the case that the power management integrated circuit 11 provides a power supply voltage of 0.8 V though a power line to the application processor 12. In this case, when a current I flows through the power line, a voltage drop of (I*Rp1) may occur. Thus, when the current I that flows through the power line varies rapidly, the lowered power supply voltage may take a while to be recovered due to the parasitic inductance Lp1.

The user device 10 illustrated in FIG. 1 includes capacitors Ce1 to Ce4 that are respectively connected to the power lines to reduce the influence of the parasitic components of the power lines. For example, when the current I varies rapidly, a lowered power supply voltage may be quickly recovered by using the capacitors Ce1 to Ce4 connected to the power lines. In the user device 10 of FIG. 1, because the capacitors Ce1 to Ce4 are respectively connected to the power lines, the influence of the parasitic components of the power lines may be reduced.

Figure 2:
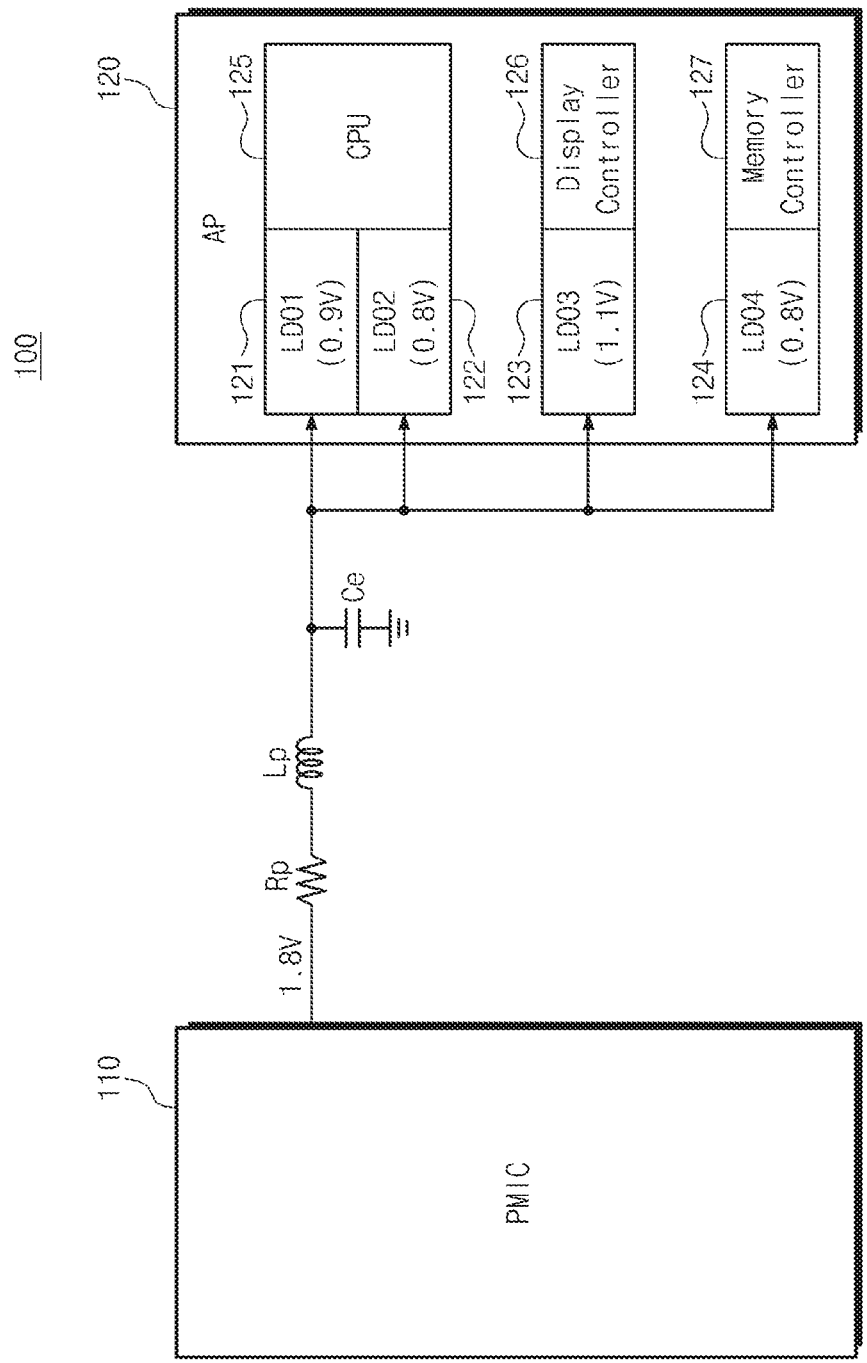
FIG. 2 is a block diagram illustrating a user system according to an exemplary embodiment of the inventive concept.

FIG. 2 is a block diagram illustrating a user system according to an exemplary embodiment of the inventive concept. Referring to FIG. 2, a user device 100 may include a power management integrated circuit 110 and an application processor 120. For example, the application processor 120 may be used in a mobile device. The power management integrated circuit 110 may provide the application processor 120 with a power supply voltage through a power line.

The exemplary embodiment of the inventive concept shown in FIG. 2 has a power supply voltage of 1.8 V that is provided to the application processor 120 through a single power line. The application processor 120 may be supplied with the power supply voltage of 1.8 V from the power management integrated circuit 110 and may internally generate power supply voltages of 0.8 V, 0.9 V, and 1.1 V. To accomplish this, the application processor 120 may include a plurality of LDO regulators. The plurality of LDO regulators may be integrated in the application processor 120. The application processor 120 may generate a plurality of power supply voltages by using the integrated LDO regulators.

As illustrated in FIG. 2, the application processor 120 may include first to fourth LDO regulators 121 to 124. The first to fourth LDO regulators 121 to 124 may have the same internal configuration and operation. The first LDO regulator 121 may receive an external voltage of 1.8 V to generate an internal voltage of 0.9 V. The second LDO regulator 122 may generate an internal voltage of 0.8 V on the basis of the external voltage of 1.8 V. The internal voltages that the first and second LDO regulators 121 and 122 generate may be provided to a central processing unit (CPU) 125. The third LDO regulator 123 may generate an internal voltage of 1.1 V on the basis of the external voltage of 1.8 V and may provide the internal voltage of 1.1 V to a display controller 126. The fourth LDO regulator 124 may generate an internal voltage of 0.8 V on the basis of the external voltage of 1.8 V and may provide the internal voltage of 0.8 V to a memory controller 127.

According to the above-described user device 100 of FIG. 2, the number of power lines or the number of power line capacitors is decreased. Thus, the routing effect of a printed circuit board (PCB) may be reduced. Furthermore, the user device 100 can reduce the influence of the parasitic components as well as reduce area and cost.

Figure 3:
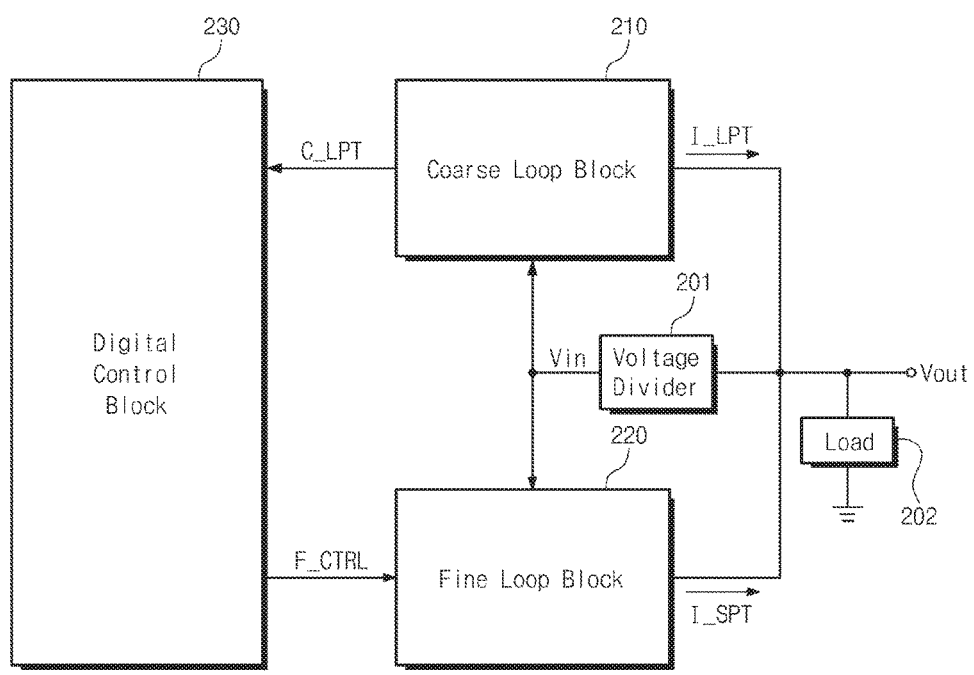
FIG. 3 is block diagram illustrating a low dropout voltage (LDO) regulator of FIG. 2 according to an exemplary embodiment of the inventive concept.

FIG. 3 is block diagram illustrating the LDO regulator of FIG. 2 according to an exemplary embodiment of the inventive concept. The LDO regulator 121a illustrated in FIG. 3 may be a digital LDO regulator and may have the same configuration and operation as the first to fourth LDO regulators 121 to 124.

Referring to FIG. 3, the LDO regulator 121a may include a voltage divider 201, a coarse loop block 210, a fine loop block 220, and a digital control block 230. The LDO regulator 121a may provide an output voltage Vout to a load 202. The voltage divider 201 may receive the output voltage Vout and may provide a divided input voltage Vin to the coarse loop block 210 and the fine loop block 220, respectively.

The coarse loop block 210 may adjust the output voltage Vout within a large voltage range. The coarse loop block 210 may receive the input voltage Vin and may output coarse code C_LPT. The coarse loop block 210 may output the coarse code C_LPT to the digital control block 230. The coarse loop block 210 may adjust a coarse current I_LPT to be provided to an output terminal on the basis of the coarse code C_LPT.

The coarse loop block 210 may adjust the coarse current I_LPT by using a large power transistor LPT. For example, the large power transistor LPT may be a transistor having a large size. The large power transistor LPT may supply a large amount of current and may adjust the output voltage Vout within the large voltage range.

The fine loop block 220 may finely adjust the output voltage Vout within a small voltage range. The fine loop block 220 may receive the input voltage Vin and may internally generate fine code C_SPT in response to a fine loop control signal F_CTRL. The fine loop control signal F_CTRL may be provided from the digital control block 230. After the coarse current I_LPT is provided to the output terminal, the fine loop block 220 may supply a fine current I_SPT to the output terminal.

The fine loop block 220 may adjust the fine current I_SPT by using a small power transistor (SPT). For example, the small power transistor SPT may be a transistor having a small size. The small power transistor SPT may supply a small amount of current and may adjust the output voltage Vout within the small voltage range.

The digital control block 230 may control the fine loop block 220. The digital control block 230 may receive the coarse code C_LPT from the coarse loop block 210 and may provide the fine loop control signal F_CTRL to the fine loop block 220. The digital control block 230 may control the fine loop block 220 such that the fine loop block 220 operates immediately after the coarse loop block 210 operates. Because the digital control block 230 changes a loop operation quickly, a transition effect may be reduced.

Figure 4:
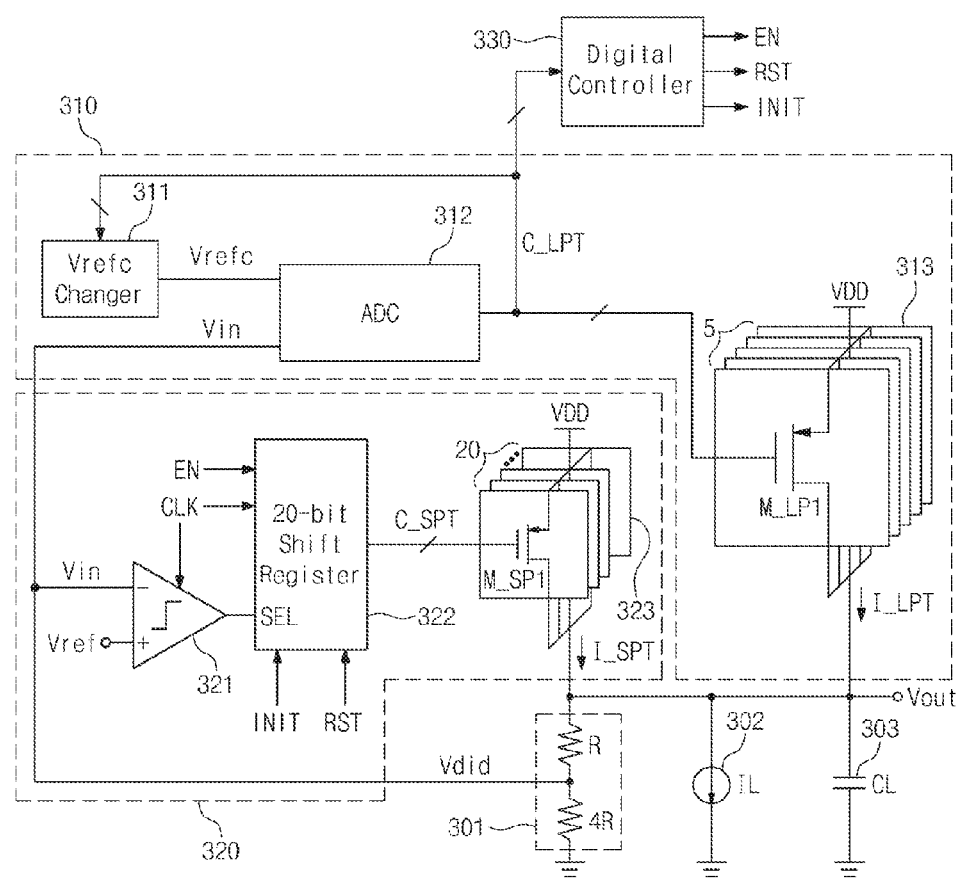
FIG. 4 is block diagram illustrating the LDO regulator of FIG. 2 according to an exemplary embodiment of the inventive concept.

FIG. 4 is block diagram illustrating the LDO regulator of FIG. 2 according to an exemplary embodiment of the inventive concept. Referring to FIG. 4, the LDO regulator 121b may include a voltage divider circuit 301, a load driver circuit 302, and a load capacitor 303.

The voltage divider circuit 301 is connected between an output terminal and a ground terminal and may divide the output voltage Vout to generate a division voltage Vdid. For example, the voltage divider circuit 301 includes a first resistor (e.g., R) connected between the output terminal and a division node and a second resistor (e.g., 4R) connected between the division node and the ground terminal. When the output voltage Vout is approximately 0.9 V, the division voltage Vdid is approximately 0.72 V. A load current IL may flow through the load driver circuit 302. The load capacitor 303 may have a load capacitance CL.

The LDO regulator 121b may further include a coarse loop circuit 310, a fine loop circuit 320, and a digital controller 330. The LDO regulator 121b may receive the power supply voltage VDD (e.g., from the power line between the PMIC 110 and the application processor 120 in FIG. 2) and may adjust the output voltage Vout. The coarse loop circuit 310 may adjust the output voltage Vout within the large voltage range, and the fine loop circuit 320 may adjust the output voltage within the small voltage range.

Referring to FIG. 4, the coarse loop circuit 310 may include a reference voltage changer 311, an analog-to-digital converter (ADC) 312, and a coarse current driver 313. The reference voltage changer 311 may receive the coarse code C_LPT from the ADC 312 and may change a coarse reference voltage Vrefc. The reference voltage changer 311 may provide the changed coarse reference voltage Vrefc to the ADC 312.

The following table shows an operation condition of the reference voltage changer 311.

TABLE 1

| C_LPT[5:1] | Vrefc |
|---|---|
| 11111 | 648 mV |
| 11110 | 684 mV |
| 11100 | 720 mV |

TABLE 1-continued

| C_LPT[5:1] | Vrefc |
|---|---|
| 11000 | 756 mV |
| 10000 | 792 mV |
| 00000 | 828 mV |

Referring to table 1, the reference voltage changer 311 may receive 5-bit coarse code C_LPT[5:1] and may change the coarse reference voltage Vrefc such that the coarse reference voltage Vrefc has a voltage level corresponding to the received 5-bit coarse code C_LPT[5:1]. For example, when the coarse code C_LPT[5:1] is "11111", the coarse reference voltage Vrefc may be set to 648 mV. When the coarse code C_LPT[5:1] is "11110", the coarse reference voltage Vrefc may be set to 684 mV; when the coarse code C_LPT[5:1] is "11100", the coarse reference voltage Vrefc may be set to 720 mV. When the coarse code C_LPT[5:1] is "11000", the coarse reference voltage Vrefc may be set to 756 mV; when the coarse code C_LPT[5:1] is "10000", the coarse reference voltage Vrefc may be set to 792 mV; when the coarse code C_LPT[5:1] is "00000", the coarse reference voltage Vrefc may be set to 828 mV. The coarse reference voltage Vrefc may increase as the load current IL increases; the coarse reference voltage Vrefc may decrease as the load current IL decreases.

The reference voltage changer 311 may increase the coarse reference voltage Vrefc when the load current IL increases. In addition, the reference voltage changer 311 may decrease the coarse reference voltage Vrefc when the load current IL decreases. The reference voltage changer 311 may adjust the output voltage Vout more easily during a coarse loop operation by changing the coarse reference voltage Vrefc.

The ADC 312 may receive the input voltage Vin and the coarse reference voltage Vrefc and may generate the coarse code C_LPT. For example, the ADC 312 may generate first to fifth coarse code bits C_LPT[1] to C_LPT[5]. The first to fifth coarse code bits C_LPT[1] to C_LPT[5] may be provided to the reference voltage changer 311 and the coarse current driver 313.

The coarse current driver 313 may receive the coarse code C_LPT from the ADC 312 and may supply the coarse reference voltage Vrefc to the output terminal. For example, the coarse current driver 313 may include first to fifth PMOS transistors M_LP1 to M_LP5. The first to fifth PMOS transistors M_LP1 to M_LP5 may be connected between a power terminal and the output terminal. Here, the power terminal may be supplied with the power supply voltage VDD, and the output voltage Vout may be output from the output terminal.

The first to fifth PMOS transistors M_LP1 to M_LP5 may be controlled by the first to fifth coarse code bits C_LPT[1] to C_LPT[5], respectively. The first PMOS transistor M_LP1 may be controlled by the first coarse code bit C_LPT[1]. The coarse current driver 313 may adjust the coarse current I_LPT to be provided to the output terminal on the basis of the coarse code C_LPT from the ADC 312. The largest amount of coarse current I_LPT may be provided when the first to fifth PMOS transistors M_LP1 to M_LP5 are all turned on. The amount of coarse current I_LPT may decrease in proportion to the number of transistors, which are turned off, from among the first to fifth PMOS transistors M_LP1 to M_LP5.

As illustrated in FIG. 4, the fine loop circuit 320 may include a comparator 321, a shift register 322, and a fine current driver 323. The fine loop circuit 320 may finely adjust the output voltage Vout. The fine loop circuit 320 may provide the fine current I_SPT to the output terminal.

The comparator 321 may compare the input voltage Vin with a reference voltage Vref and may provide the comparison result to the shift register 322. The comparator 321 may receive the reference voltage Vref through a positive input terminal (+) and may receive the input voltage Vin through a negative input terminal (−). The comparator 321 may operate in synchronization with a clock signal CLK. The comparator 321 may provide the comparison result to a selection terminal SEL of the shift register 322 through an output terminal thereof. When the reference voltage Vref is higher in level than the input voltage Vin, the comparator 321 may output a selection signal SEL of "1"; when the reference voltage Vref is lower in level than the input voltage Vin, the comparator 321 may output the selection signal SEL of "0".

The shifter register 322 may operate in response to an enable signal EN. The enable signal EN may be provided from the digital controller 330. The enable signal EN may be provided to the shift register 322 after the coarse loop circuit 310 operates. The shift register 322 may operate in synchronization with the clock signal CLK. The shift register 322 may receive the selection signal SEL from the comparator 321 and may output the fine code C_SPT. For example, assuming that the shift register 322 is a 20-bit shift register, the shift register 322 may output a 20-bit fine code C_SPT [20:1].

The fine current driver 323 may receive the fine code C_SPT from the shift register 322 and may supply the fine current I_SPT to the output terminal. For example, the fine current driver 323 may include first to twentieth PMOS transistors M_SP1 to M_SP20. The first to twentieth PMOS transistors M_SP1 to M_SP20 may be connected between the power terminal and the output terminal. The first to twentieth PMOS transistors M_SP1 to M_SP20 may be controlled by first to twentieth fine code bits C_SPT[1] to C_SPT[20], respectively.

For example, the first PMOS transistor M_SP1 may be controlled by the first fine code bit C_SPT[1]. The coarse current driver 323 may adjust the fine current I_SPT to be provided to the output terminal on the basis of the fine code C_SPT from the shift register 322. The largest amount of fine current I_SPT may be provided when the first to twentieth PMOS transistors M_SP1 to M_SP20 are all turned on. The amount of fine current I_LPT may decrease in proportion to the number of transistors, which are turned off, from among the first to twentieth PMOS transistors M_SP1 to M_SP20.

An operation of the fine current driver 323 may be the same as that of the coarse current driver 313. However, the size of each PMOS transistor of the fine current driver 323 may be smaller than that of each PMOS transistor of the coarse current driver 313. The fine current driver 323 may adjust the output voltage Vout within the small voltage range by using a number of transistors each of which drives a small amount of current.

Continuing to refer to FIG. 4, the digital controller 330 may control the fine loop circuit 320. The digital controller 330 may receive the coarse code C_LPT and may output a control signal. The control signal may include the enable signal EN, a reset signal RST, and an initialization signal INIT. The enable signal EN may be a signal for operating the shift register 322. The reset signal RST may be a signal for resetting the fine code C_SPT of the shift register 322. The initialization signal INIT may be a signal for determining an initial fine current. The initialization signal INIT may be provided to the shift register 322.

The digital controller 330 that uses a simple counter may allow a fine loop operation to start immediately after a coarse loop operation. Because the digital controller 330 changes a loop operation quickly, a transition effect may be reduced. An internal configuration and operation of the digital controller 330 may be described below.

Figure 5:
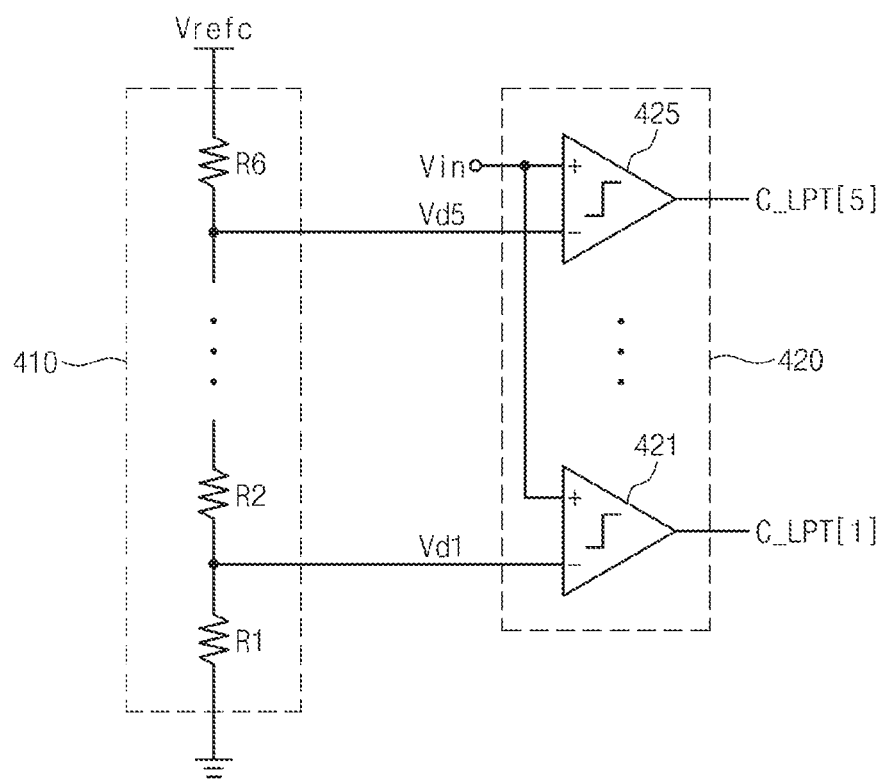
FIG. 5 is a circuit diagram illustrating an analog-to-digital converter (ADC) illustrated in FIG. 4 according to an exemplary embodiment of the inventive concept.

FIG. 5 is a circuit diagram illustrating the analog-to-digital converter ADC illustrated in FIG. 4 according to an exemplary embodiment of the inventive concept. The ADC 312a illustrated in FIG. 5, e.g., a flash ADC, may include a voltage divider circuit 410 and a comparator circuit 420. In FIG. 5, the ADC 312 may generate a 5-bit binary code.

The voltage divider circuit 410 may include first to sixth resistors R1 to R6. The first to sixth resistors R1 to R6 may have the same resistance value or may have different resistance values. The voltage divider circuit 410 may receive the coarse reference voltage Vrefc and may generate first to fifth division voltages Vd1 to Vd5. The first to fifth division voltages Vd1 to Vd5 may be provided to the comparator circuit 420.

The comparator circuit 420 may include first to fifth comparators 421 to 425. The input voltage Vin may be provided in common to the first to fifth comparators 421 to 425. For example, the input voltage Vin may be the division voltage Vdid of the voltage divider circuit 301 illustrated in FIG. 4. The input voltage Vin may be provided in common to positive input terminals (+) of the first to fifth comparators 421 to 425. The first comparator 421 may receive the input voltage Vin through a positive input terminal (+) and may receive a first division voltage Vd1 through a negative input terminal (−). The first comparator 421 may compare the input voltage Vin with the first division voltage Vd1 and may generate a first coarse code bit C_LPT[1] of "1" or "0" on the basis of the comparison result.

For example, when the input voltage Vin is higher in level than the first division voltage Vd1, the first comparator 421 may generate the first coarse code bit C_LPT[1] of "1"; when the input voltage Vin is lower in level than the first division voltage Vd1, the first comparator 421 may generate the first coarse code bit C_LPT[1] of "0". Like the first comparator 421, the second to fifth comparators 422 to 425 may generate second to fifth coarse code bits C_LPT[2] to C_LPT[5], respectively. The comparator circuit 420 may provide the coarse code C_LPT[5:1] to the coarse current driver 313 (refer to FIG. 4).

Figure 6:
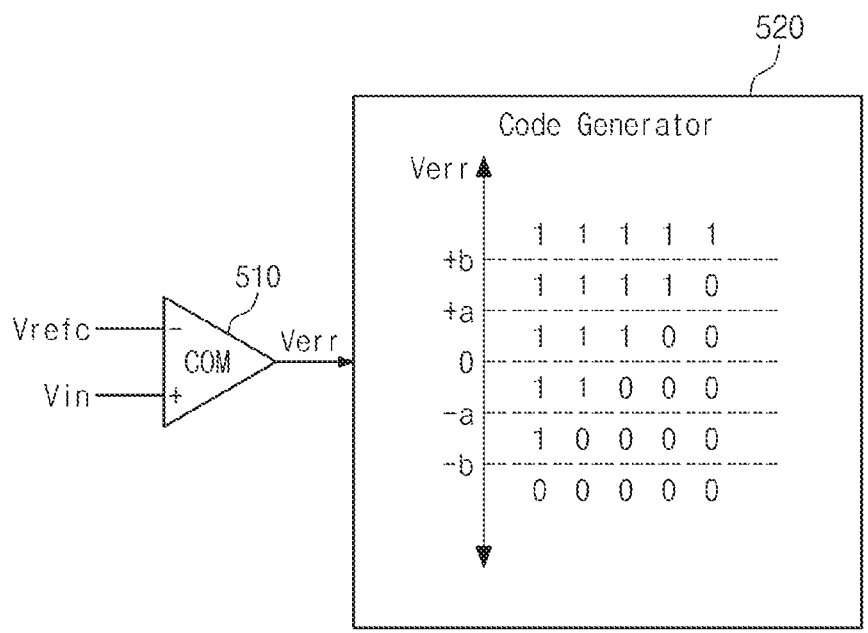
FIG. 6 is a circuit diagram illustrating the ADC illustrated in FIG. 4 according to an exemplary embodiment of the inventive concept.

FIG. 6 is a circuit diagram illustrating the analog-to-digital converter ADC illustrated in FIG. 4 according to an exemplary embodiment of the inventive concept. An ADC 312b illustrated in FIG. 6 may be a digital ADC and may include a comparator (COM) 510 and a code generator 520.

The comparator 510 may compare the input voltage Vin with the coarse reference voltage Vrefc. The comparator 510 may receive the coarse reference voltage Vrefc through a negative input terminal (−) and may receive the input voltage Vin through a positive input terminal (+). The comparator 510 may compare the input voltage Vin with the coarse reference voltage Vrefc and may provide an error voltage Verr to the code generator 520.

The code generator 520 may generate the coarse code on the basis of the error voltage Verr. For example, when the error voltage Verr is "+b" or more, the coarse code C_LPT [5:1] may be "11111". When the error voltage Verr is between "+a" and "+b", the coarse code C_LPT[5:1] may be "11110". When the error voltage Verr is between "0" and "+a", the coarse code C_LPT[5:1] may be "11100". When the error voltage Verr is between "−a" and "0", the coarse code C_LPT[5:1] may be "11000". When the error voltage Verr is between "−b" and "−a", the coarse code C_LPT[5:1] may be "10000". When the error voltage Verr is smaller than "−b", the coarse code C_LPT[5:1] may be "00000". The code generator 520 may provide the coarse code C_LPT[5:1] to the coarse current driver 313 (refer to FIG. 4).

Figure 7A:
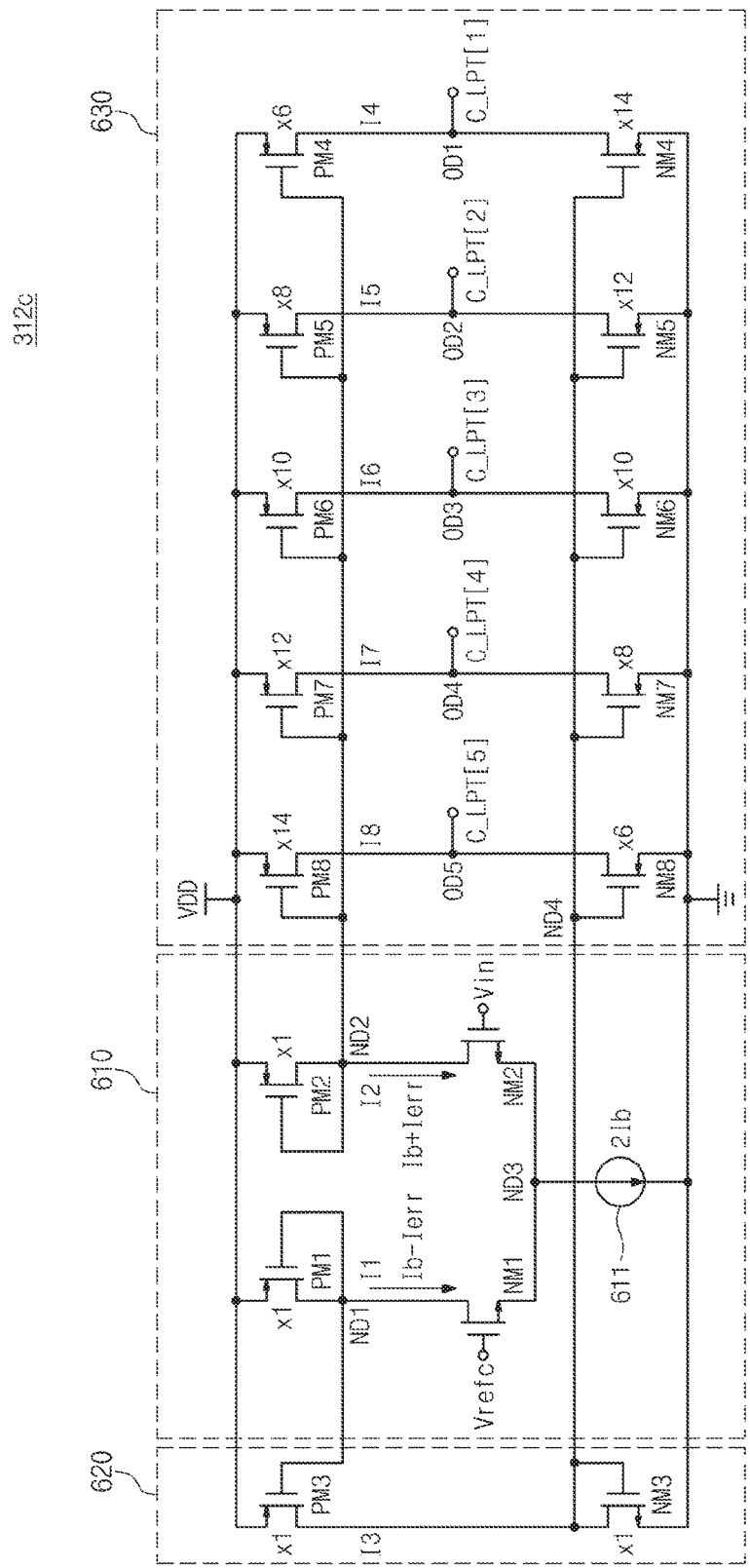
FIG. 7A is a circuit diagram illustrating the ADC illustrated in FIG. 4 according to an exemplary embodiment of the inventive concept.

FIG. 7A is a circuit diagram illustrating the analog-to-digital converter ADC illustrated in FIG. 4 according to an exemplary embodiment of the inventive concept. The ADC 312c illustrated in FIG. 7A, e.g., a current mirror flash ADC (CMF ADC), may include a comparator circuit 610, a first current mirror circuit 620, and a second current mirror circuit 630.

The comparator circuit 610 may include first and second PMOS transistors PM1 and PM2, first and second NMOS transistors NM1 and NM2, and a current source 611. For example, the size of each of the first and second PMOS transistors PM1 and PM2 is "1". This is expressed in FIG. 7A with "x1".

The first PMOS transistor PM1 is connected between the power terminal and a first node ND1. A gate of the first PMOS transistor PM1 is connected to the first node ND1. The first PMOS transistor PM1 may be diode-connected. The second PMOS transistor PM2 is connected between the power terminal and a second node ND2. A gate of the second PMOS transistor PM2 is connected to the second node ND2.

The second PMOS transistor PM2 may be diode-connected. The first NMOS transistor NM1 is connected between the first node ND1 and a third node ND3. A gate of the first NMOS transistor NM1 is configured to receive the coarse reference voltage Vrefc. The second NMOS transistor NM2 is connected between the second node ND2 and the third node ND3. A gate of the second NMOS transistor NM2 is configured to receive the input voltage Vin.

The current source 611 is connected between the third node ND3 and the ground terminal. A current flowing through the current source 611 may be fixed. For example, a fixed current of "2*Ib" may flow through the current source 611. The current source 611 may be implemented with an NMOS transistor.

The comparator circuit 610 may form first and second current paths I1 and I2. The first current path I1 may pass through the first PMOS transistor PM1 and the first NMOS transistor NM1. The second current path I2 may pass through the second PMOS transistor PM2 and the second NMOS transistor NM2. The comparator circuit 610 may compare the input voltage Vin with the coarse reference voltage Vrefc. The amount of currents that flow through, respectively, the first current path I1 and the second current path I2 may vary according to the coarse reference voltage Vrefc and the input voltage Vin.

The sum of currents flowing through, respectively, the first current path I1 and the second current path I2 may be fixed to "2*Ib". When the input voltage Vin is higher in level than the coarse reference voltage Vrefc, a current flowing through the second current path I2 may increase by "Ierr" (e.g., Ib+Ierr). When the input voltage Vin is higher in level than the coarse reference voltage Vrefc, a current flowing through the first current path I1 may decrease by "Ierr" (e.g., Ib−Ierr). When the input voltage Vin is lower in level than the coarse reference voltage Vrefc, a current flowing through the second current path I2 may decrease. When the input voltage Vin is lower in level than the coarse reference voltage Vrefc, a current flowing through the first current path I1 may increase.

The first current mirror circuit 620 may include a third PMOS transistor PM3 and a third NMOS transistor NM3. The third PMOS transistor PM3 is connected between the power terminal and a fourth node ND4. A gate of the third PMOS transistor PM3 is connected to the first node ND1. The gate of the third PMOS transistor PM3 is connected to the gate of the first PMOS transistor PM1. The size of the third PMOS transistor PM3 may be the same as that of the first PMOS transistor PM1. In other words, the size of the third PMOS transistor PM3 is "x1".

The first current mirror circuit 620 may form a third current path I3. The third current path I3 may pass through the third PMOS transistor PM3 and the third NMOS transistor NM3. With the current mirroring, the amount of current flowing through the third current path I3 may be the same as that of current flowing through the first current path I1.

A voltage level of the fourth node ND4 may increase as the amount of current flowing through the third current path I3 increases. In addition, a voltage level of the fourth node ND4 may decrease as the amount of current flowing through the third current path I3 decreases.

As such, the amount of current flowing through the second current path I2 may increase as the input voltage Vin increases. In this case, the amount of current flowing through each of the first and third current paths I1 and I3 may decrease, and a voltage level of the fourth node ND4 may decrease. In other words, a voltage level of the fourth node ND4 may decrease when the input voltage Vin increases, while the coarse reference voltage Vrefc remains fixed. In addition, a voltage level of the fourth node ND4 may increase as the input voltage Vin decreases.

The second current mirror circuit 630 may include fourth to eighth PMOS transistors PM4 to PM8 and fourth to eighth NMOS transistor NM4 to NM8. The fourth PMOS transistor PM4 is connected between the power terminal and a first output node OD1. A gate of the fourth PMOS transistor PM4 is connected to the second node ND2. The size of the fourth PMOS transistor PM4 may be different from that of the second PMOS transistor PM2. For example, in the case that the size of the second PMOS transistor PM2 is "1", the size of the fourth PMOS transistor PM4 may be six-times the size of the second PMOS transistor PM2. This is expressed in FIG. 7A with "x6". Below, the fourth PMOS transistor may be referred to as having the size of "x6".

The fourth NMOS transistor NM4 is connected between the first output node OD1 and the ground terminal. A gate of the fourth PMOS transistor NM4 is connected to the fourth node ND4. For example, in the case that the size of the third NMOS transistor NM3 is "1", the fourth NMOS transistor NM4 may have the size of "x14". The fourth PMOS transistor PM4 and the fourth NMOS transistor NM4 may form a fourth current path I4. The first coarse code bit C_LPT[1] may be output from the first output node OD1.

The fifth PMOS transistor PM5 and the fifth NMOS transistor NM5 may form a fifth current path I5. The fifth PMOS transistor PM5 has the size of "x8", and the fifth NMOS transistor NM5 has the size of "x12". The second coarse code bit C_LPT[2] may be output from a second output node OD2.

The sixth PMOS transistor PM6 and the sixth NMOS transistor NM6 may form a sixth current path I6. The sixth PMOS transistor PM6 has the size of "x10", and the sixth NMOS transistor NM6 has the size of "x10". The third coarse code bit C_LPT[3] may be output from a third output node OD3. The seventh PMOS transistor PM7 and the seventh NMOS transistor NM7 may form a seventh current path 17. The seventh PMOS transistor PM7 has the size of "x12", and the seventh NMOS transistor NM7 has the size of "x8". The fourth coarse code bit C_LPT[4] may be output from a fourth output node OD4. The eighth PMOS transistor PM8 and the eighth NMOS transistor NM8 may form an eighth current path 18. The eighth PMOS transistor PM8 has the size of "x14", and the eighth NMOS transistor NM8 has the size of "x6". The fifth coarse code bit C_LPT[5] may be output from a fifth output node OD5.

The fourth current path 14 may be implemented with the fourth PMOS transistor PM4 of the smallest size (x6) and the fourth NMOS transistor NM4 of the largest size (x14). The fourth current path 14 may transition to a low level most quickly as compared to the fifth to eighth current paths. For example, voltage levels of the second and fourth node ND2 and ND4 may increase as the input voltage Vin decreases. As a voltage level of the fourth node ND4 increases, a voltage of the first output node OD1 may be discharged through the fourth NMOS transistor NM4 most quickly. In this case, the first coarse code bit C_LPT[1] may be set to "1" first. In other words, the first coarse code bit C_LPT[1] of the first to fifth coarse code bits is set first.

The eighth current path 18 may be implemented with the eighth PMOS transistor PM8 of the largest size (x14) and the eighth NMOS transistor NM8 of the smallest size (x6). The eighth current path 18 may transition to a high level most quickly as compared to the fourth to seventh current paths. For example, voltage levels of the second and fourth node ND2 and ND4 may decrease as the input voltage Vin increases. As a voltage level of the second node ND2 decreases, a voltage of the fifth output node OD5 may be discharged through the eighth NMOS transistor PM8 most quickly. In this case, the fifth coarse code bit C_LPT[5] may be set to "1" first. In other words, the fifth coarse code bit C_LPT[5] of the first to fifth coarse code bits is set first.

FIG. 8 is a table for describing the current mirror flash ADC illustrated in FIG. 7A according to an exemplary embodiment of the inventive concept. Referring to FIGS. 7A and 8, the current mirror flash ADC 312 may obtain the error voltage Verr on the basis of a difference between the input voltage Vin and the coarse reference voltage Vrefc. The error voltage Verr may be obtained through the following equation.

$$Verr = Vin - Vrefc \quad \text{[Equation 1]}$$

When the input voltage Vin is much higher in level than the coarse reference voltage Vrefc (e.g., 72 mV or more), each of the second and fourth nodes ND2 and ND4 of FIG. 7A may have a very low voltage level in proportion thereto. In this case, the fourth to eighth PMOS transistors PM4 to PM8 may all be turned on, and the fourth to eighth NMOS transistors NM4 to NM8 may all be turned off. According to the above-described operation, when the error voltage Verr is greater than or equal to 72 mV, the coarse code C_LPT [5:1] may be "11111".

Voltage levels of the second and fourth node ND2 and ND4 may increase as the input voltage Vin decreases. As a voltage level of the fourth node ND4 increases, a voltage of the first output node OD1 may be discharged through the fourth NMOS transistor NM4 most quickly. In other words, when the error voltage Verr ranges from 36 mV to 72 mV, the coarse code C_LPT[5:1] may be "11110". Accordingly, when the error voltage Verr ranges from 0 to 36 mV, the coarse code C_LPT[5:1] may be "11100". When the error voltage Verr ranges from -36 mV to 0, the coarse code C_LPT[5:1] may be "11000". When the error voltage Verr ranges from -72 mV to -36 mV, the coarse code C_LPT [5:1] may be "10000".

When a difference between the input voltage Vin and the coarse reference voltage Vrefc is 72 mV or more, each of the second and fourth nodes ND2 and ND4 of FIG. 7A may have the highest voltage level. In this case, the fourth to eighth PMOS transistors PM4 to PM8 may all be turned off, and the fourth to eighth NMOS transistors NM4 to NM8 may all be turned on. In other words, when the error voltage Verr is -72 mV or less, the coarse code C_LPT[5:1] may be "00000".

The current mirror flash ADC 312 illustrated in FIG. 7A may generate the coarse code C_LPT on the basis of a size difference between an NMOS transistor and a PMOS transistor. Because the current mirror flash ADC 312 illustrated in FIG. 7A uses a simple current mirror circuit, power consumption may be reduced. Furthermore, because the current mirror flash ADC 312 is implemented with PMOS transistors and NMOS transistors, the area thereof may be reduced.

Figure 7B:
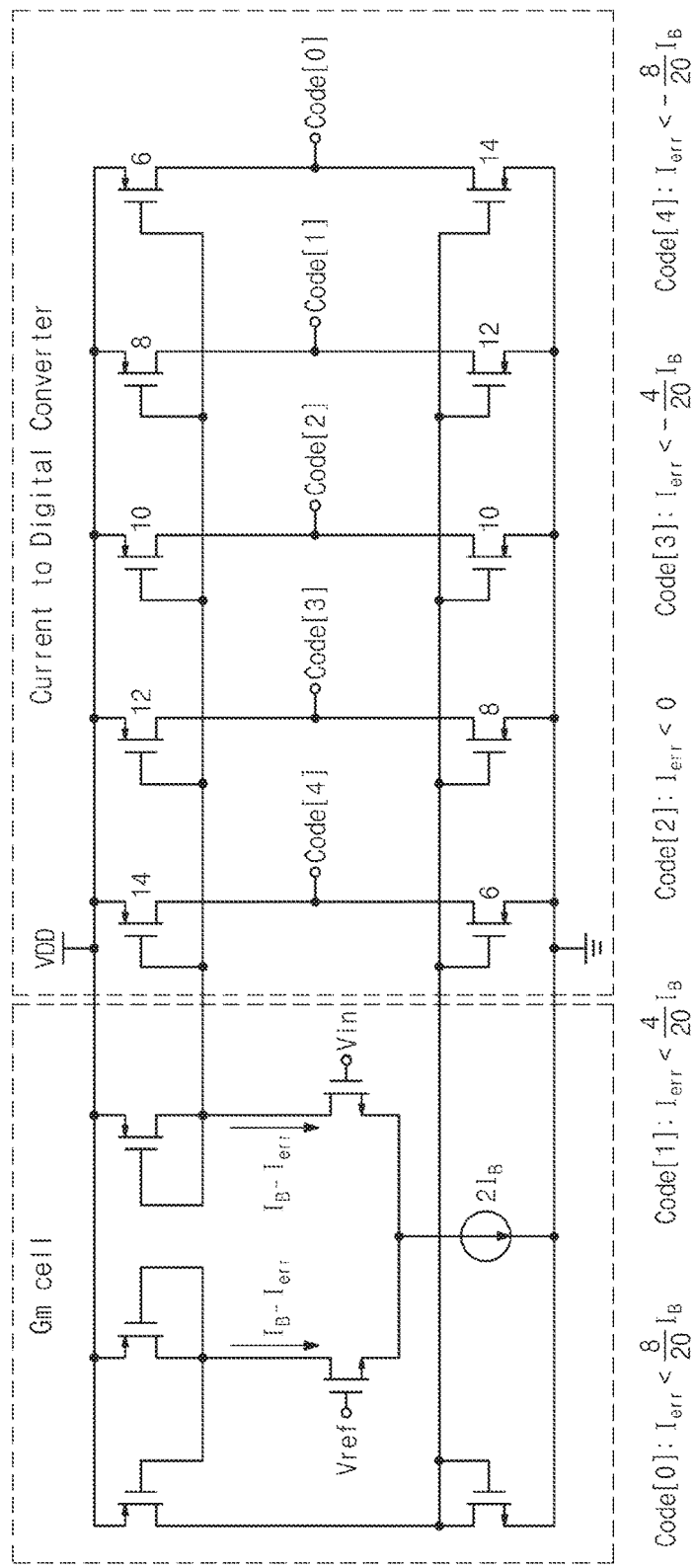
FIG. 7B is a circuit diagram illustrating a cell and a current-to-digital converter according to an exemplary embodiment of the inventive concept.

FIG. 7B is a circuit diagram illustrating a cell and a current-to-digital converter according to an exemplary embodiment of the inventive concept. The circuit elements shown in FIG. 7B are the same as or similar to those shown in FIG. 7A. Accordingly, any repetitive description of overlapping elements may be omitted.

In FIG. 7B, there is a $g_m$ cell and a current-to-digital converter. The $g_m$ cell corresponds to elements 620 and 610 in FIG. 7A. The current-to-digital converter corresponds to element 630 in FIG. 7A. In FIG. 7B, the PMOS and NMOS transistors are identified by their sizes (e.g., 6-14). FIG. 7B illustrates the first to fifth coarse code bits C_LPT[1-5] as Code[0-4].

In FIG. 7B, the Ierr values for the Codes[0-4] are: Code[0]: $I_{err} < (8/20)I_B$, Code[1]: $I_{err} < (4/20)I_B$, Code[2]: $I_{err} < 0$, Code[3]: $I_{err} < -(4/20)I_B$, and Code[4]: $I_{err} < -(8/20)I_B$.

FIG. 9 is a table for describing an operation method of a shift register illustrated in FIG. 4 according to an exemplary embodiment of the inventive concept. Referring to FIG. 9, the shift register 322 may output the 20-bit fine code C_SPT[20:1]. The shift register 322 may shift code bits to the left or the right one-by-one in synchronization with the clock signal CLK (shift left or shift right). The shift register 322 may shift code bits to the left or the right in response to the selection signal SEL.

For example, when the selection signal SEL has a value of "0" (SEL=0), the shift register 322 may shift code bits to the left one-by-one. The fine code bit C_SPT[20] may go to "1". For example, in the case that the shift register 322 outputs the fine code C_SPT[20:1] (=000 . . . 001) at "t", the shift register 322 may output the fine code C_SPT[20:1] (=000 . . . 011) at "t+1". When the selection signal SEL has a value of "1" (SEL=1), the shift register 322 may shift code bits to the right one-by-one. The fine code bit C_SPT[1] may go to "0". For example, in the case that the shift register 322 outputs the fine code C_SPT[20:1] (=011 . . . 111) at "t", the shift register 322 may output the fine code C_SPT[20:1] (=001 . . . 111) at "t+1". The shift register 322 may provide the fine code C_SPT[20:1] to the fine current driver 323.

Figure 10:
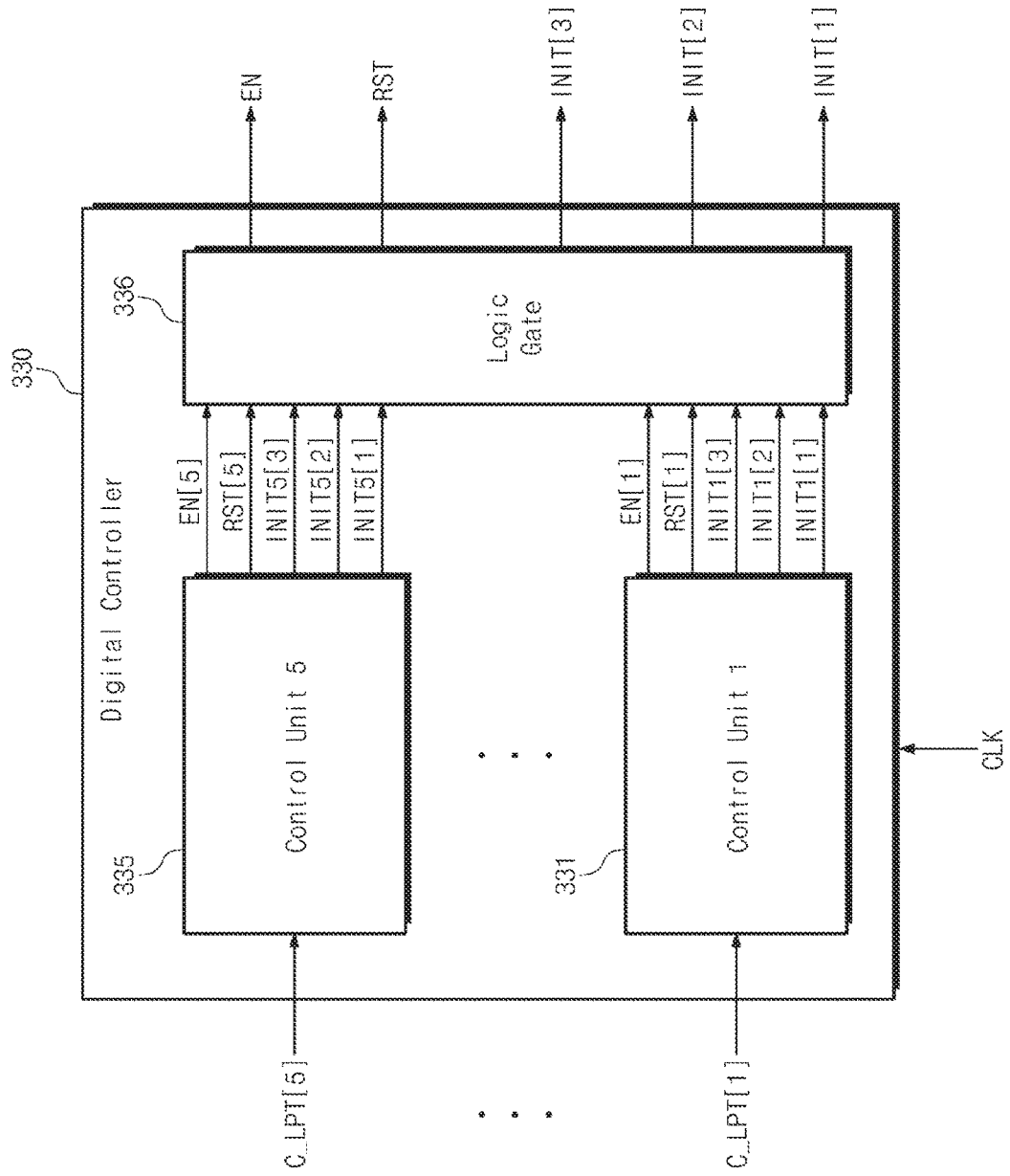
FIG. 10 is block diagram illustrating a digital controller of FIG. 4 according to an exemplary embodiment of the inventive concept.

FIG. 10 is a block diagram illustrating the digital controller of FIG. 4 according to an exemplary embodiment of the inventive concept. The digital controller 330 illustrated in FIG. 10 may receive the coarse code C_LPT[5:1] and may generate control signals EN, RST, and INIT[3:1]. Referring to FIG. 10, the digital controller 330 may include first to fifth control units 331 to 335 and a logic gate 336.

The first control unit 331 may receive the first coarse code bit C_LPT[1] and may generate first control signals EN[1], RST[1], and INIT1[3:1]. Like the first control unit 331, the fifth control unit 335 may receive the fifth coarse code bit C_LPT[5] and may generate fifth control signals EN[5], RST[5], and INIT5[3:5]. The logic gate 336 may receive the first to fifth control signals from the first to fifth control units 331 to 335 to perform a logic operation.

For example, the logic gate 336 may output the enable signal EN by performing an OR operation on the first to fifth enable signals EN[5:1]. The logic gate 336 may output the reset signal RST by performing an OR operation on the first to fifth reset signals RST[5:1]. The logic gate 336 may output the initialization signal INIT[3:1] by performing an OR operation on the first to fifth initialization signals INIR1[3:1] to INIT5[3:1].

When the digital controller 330 switches from a coarse loop operation to a fine loop operation, the digital controller 330 may determine an initial fine current of the fine loop circuit 320 on the basis of the initialization signals INIT[3:1]. Because the digital controller 330 determines the initial fine current of the fine loop circuit 320, a transition effect due to a loop change may be reduced.

Figure 11:
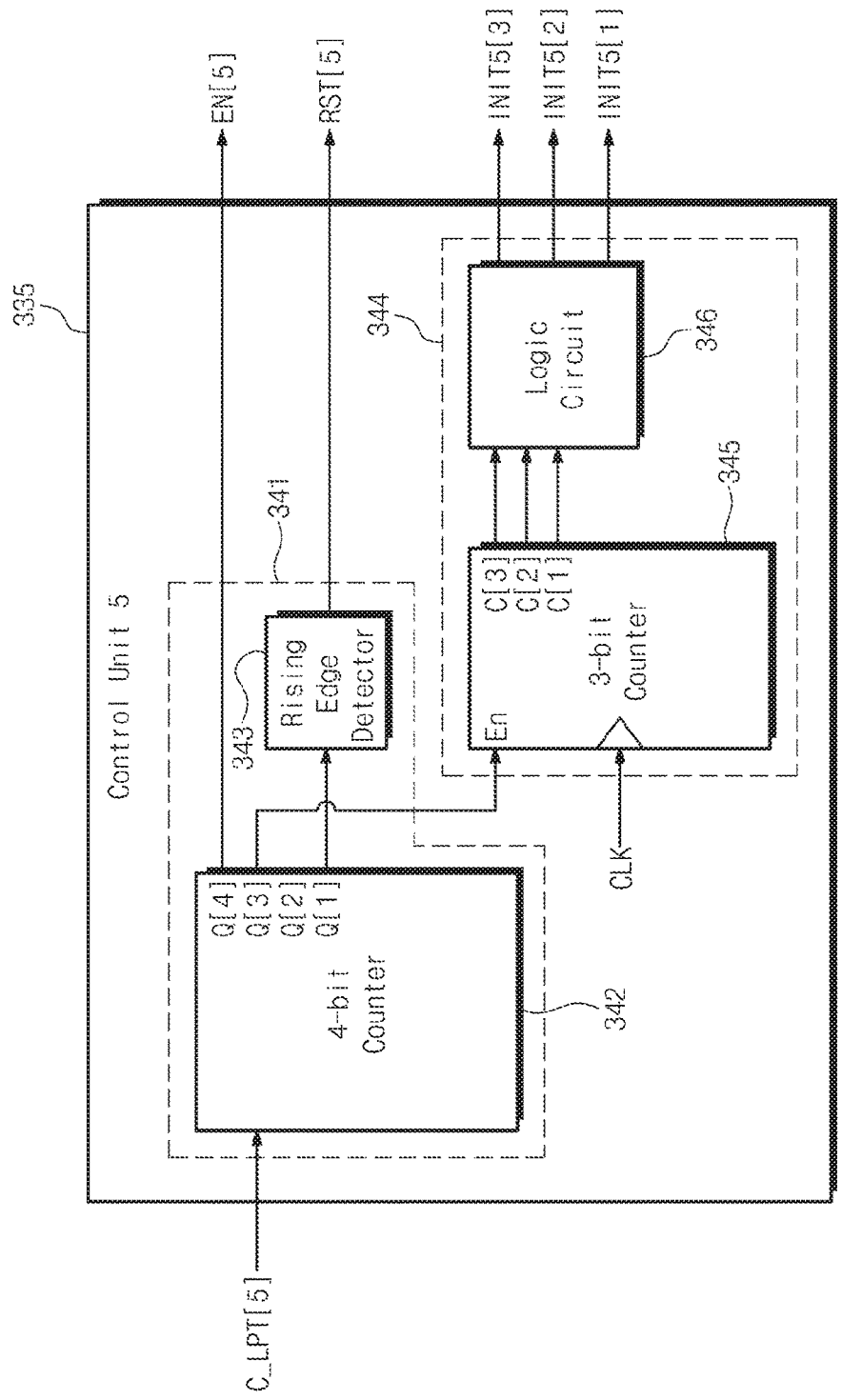
FIG. 11 is block diagram illustrating a fifth control unit illustrated in FIG. 10 according to an exemplary embodiment of the inventive concept.

FIG. 11 is block diagram illustrating the fifth control unit illustrated in FIG. 10 according to an exemplary embodiment of the inventive concept. Referring to FIG. 11, the fifth control unit 335 may receive the fifth coarse code bit C_LPT[5] and may generate fifth control signals EN[5], RST[5], and INIT5[3:1]. The fifth control unit 335 may include an enable fine loop controller (EFLC) 341 and an initial fine current selector (IFCS) 344.

The enable fine loop controller 341 may include a 4-bit counter 342 and a rising edge detector 343. The 4-bit counter 342 may provide a first output value Q[1] to the rising edge detector 343 and may provide a third output value Q[3] to the initial fine current selector 344. A fourth output value Q[4] of the 4-bit counter 342 may be used as the fifth enable signal EN[5]. The rising edge detector 343 may detect a rising edge of the first output value Q[1] and may output the fifth reset signal RST[5] as the detection result. The enable fine loop controller 341 may receive the fifth coarse code bit C_LPT[5] and may generate the fifth enable signal EN[5] and the fifth reset signal RST[5].

Figure 12:
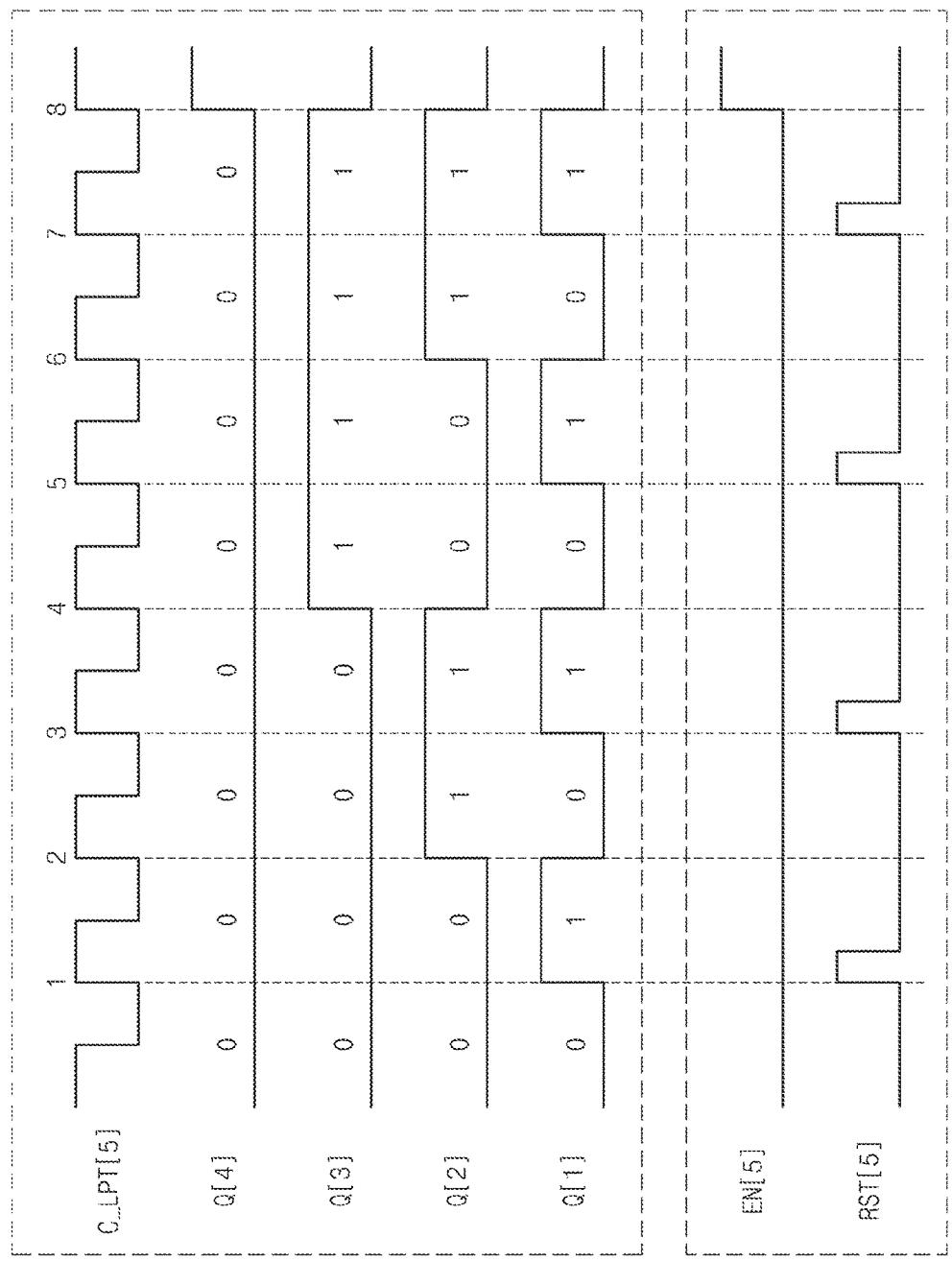
FIG. 12 is a timing diagram for describing an operation of an enable fine loop controller illustrated in FIG. 11 according to an exemplary embodiment of the inventive concept.

FIG. 12 is a timing diagram for describing an operation of the enable fine loop controller illustrated in FIG. 11 according to an exemplary embodiment of the inventive concept. Referring to FIGS. 11 and 12, the 4-bit counter 342 may generate a 4-bit output Q[4:1] on the basis of the fifth coarse code bit C_LPT[5]. The 4-bit counter 342 may generate "0000" during a first period of the fifth coarse code C_LPT[5], "0001" during a second period thereof, and "0010" during a third period thereof. Accordingly, the 4-bit counter 342 may generate "0110" during a seventh period of the fifth coarse code C_LPT[5] and "0111" during an eighth period thereof. The fifth enable signal EN[5] may be obtained from the fourth output value Q[4] of the 4-bit counter 342. The fifth reset signal RST[5] may be obtained as a result of detecting a rising edge of the first output value Q[1] of the 4-bit counter 342.

Returning to FIG. 11, the initial fine current selector 344 may include a 3-bit counter 345 and a logic circuit 346. The 3-bit counter 345 may receive the third output value Q[3] of the 4-bit counter 342 at an enable terminal En. The 3-bit counter 345 may operate in response to the third output value Q[3] and may generate a 3-bit output C[3:1] in synchronization with the clock signal CLK. The 3-bit counter 345 may provide the 3-bit output C[3:1] to the logic circuit 346. The logic circuit 346 may receive the 3-bit output C[3:1] and may output the fifth initialization signals INIT5[3:1].

Figure 13:
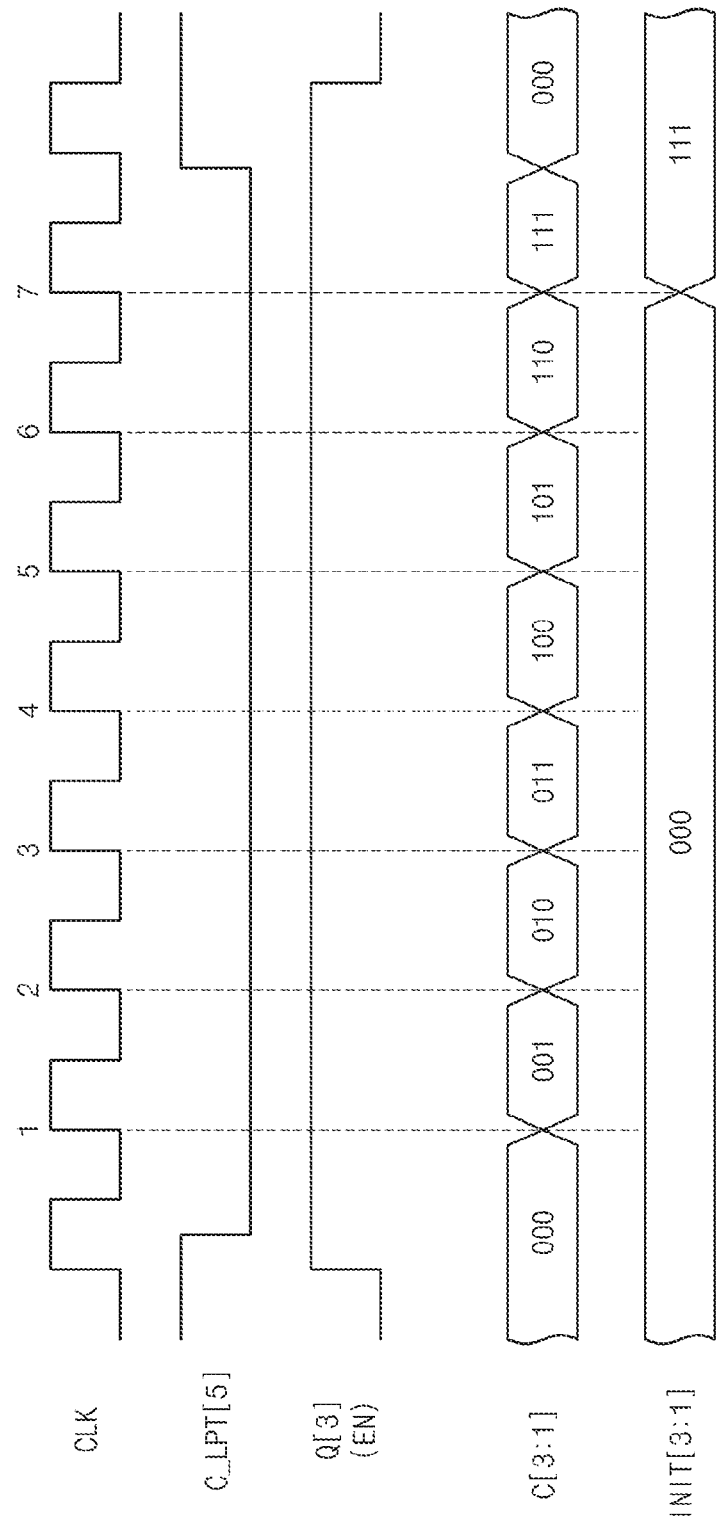
FIG. 13 is a timing diagram for describing an operation of an initial fine current selector illustrated in FIG. 11 according to an exemplary embodiment of the inventive concept.

FIG. 13 is a timing diagram for describing an operation of the initial fine current selector illustrated in FIG. 11 according to an exemplary embodiment of the inventive concept. FIG. 13 is an enlarged timing diagram of a fifth period (fourth and fifth rising edge periods) of FIG. 12.

Referring to FIGS. 11 and 13, the 3-bit counter 345 may generate the 3-bit output Q[3:1] in synchronization with the clock signal CLK. The 3-bit counter 345 may generate "000" during a first period of the clock signal CLK. The 3-bit counter 345 may generate "001" in synchronization with a first rising edge of the clock signal CLK during a second period of the clock signal CLK. The 3-bit counter 345 may generate "010" during a third period of the clock signal CLK in synchronization with a second rising edge of the clock signal CLK. In addition, the 3-bit counter 345 may generate "101" during a sixth period of the clock signal CLK and may generate "110" during a seventh period of the clock signal CLK. The 3-bit counter 345 may generate "111" in synchronization with a seventh rising edge of the clock signal CLK during an eighth period of the clock signal CLK.

The logic circuit 346 may receive the output C[3:1] of the 3-bit counter 345 and may generate "000" as the initialization signal [3:1] during the first to seventh periods of the clock signal CLK. The logic circuit 346 may generate "111" as the initialization signal [3:1] in synchronization with a seventh edge of the clock signal CLK. The logic circuit 346 may provide the initialization signal INIT[3:1] to the shift register 322 of the fine loop circuit 320.

The initial fine current selector 344 may calculate a low-level period of the fifth coarse code bit C_LPT[5] by using the 3-bit counter 345. The initial fine current selector 344 may calculate the low-level period of the fifth coarse code bit C_LPT[5] and may provide the initialization signal INIT[3:1] to the shift register 322. The initial fine current selector 344 may determine an initial fine current on the basis of the initialization signal INIT[3:1].

Because the digital controller 330 uses a simple counter, the digital controller 330 may be easy to design. Because the digital controller 330 sets a fine current upon the changing of a loop operation, the digital controller 330 may finely adjust the fine current. Furthermore, the digital controller 330 may reduce a transition effect due to a loop change.

Figure 14A:
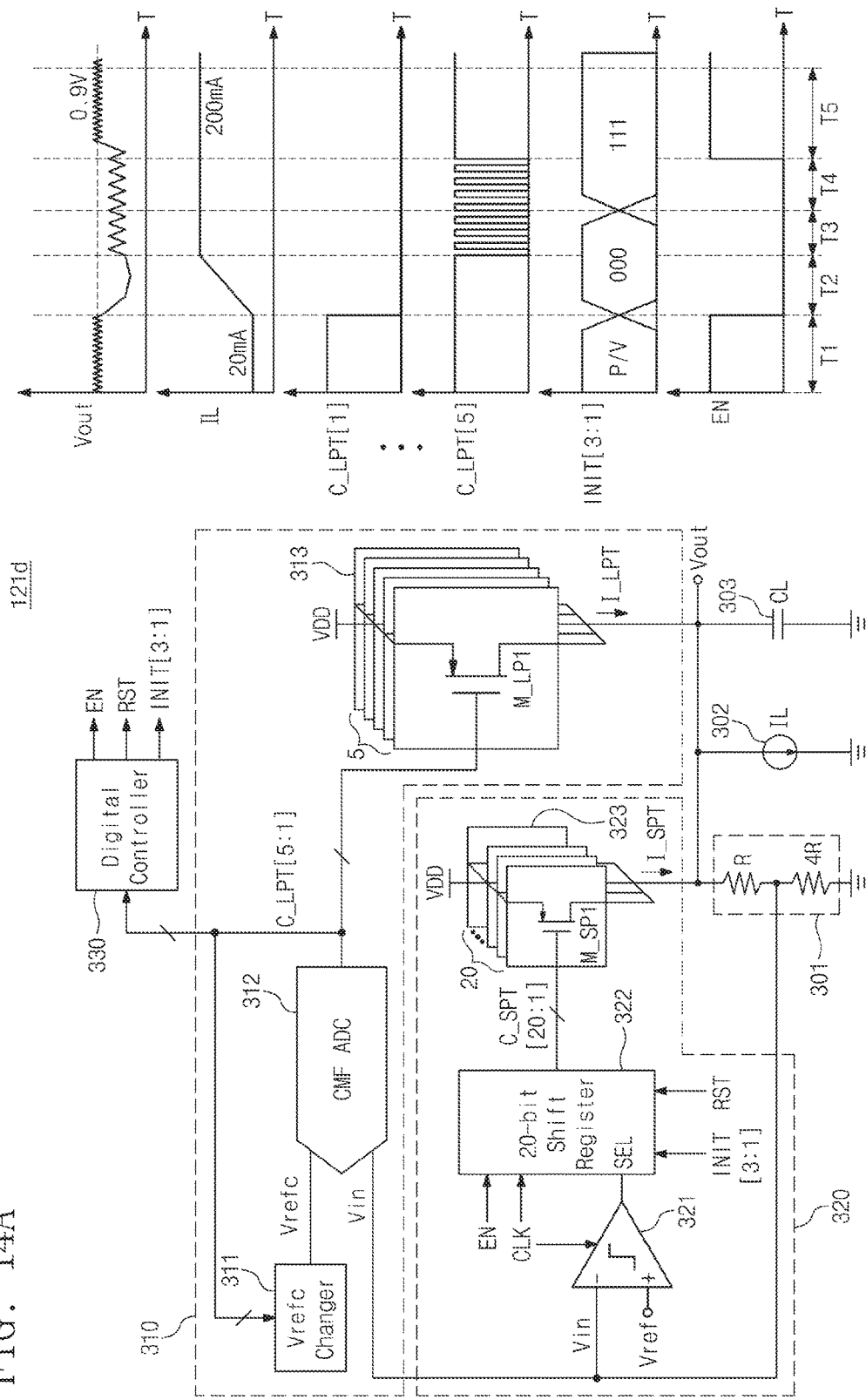
FIG. 14A is a drawing for describing an operation method of the LDO regulator of FIG. 2 according to an exemplary embodiment of the inventive concept.

FIG. 14A is a drawing for describing an operation method of the LDO regulator of FIG. 2 according to an exemplary embodiment of the inventive concept. The LDO regulator 121d illustrated in FIG. 14A may include the voltage divider circuit 301, the load driver circuit 302, the load capacitor 303, the coarse loop circuit 310, the fine loop circuit 320, and the digital controller 330.

The coarse loop circuit 310 may include the current mirror flash ADC 312 illustrated in FIG. 7A. The coarse current driver 313 of the coarse loop circuit 310 may include the first to fifth PMOS transistors M_LP1 to M_LP5. Each of the PMOS transistors M_LP1 to M_LP5 may supply a current of 40 mA. The fine current driver 323 of the fine loop circuit 320 may include the first to twentieth PMOS transistors M_SP1 to M_SP20. Each of the first to twentieth PMOS transistors M_SP1 to M_SP20 may supply a current of 2 mA.

The LDO regulator 121d may receive the power supply voltage VDD and may adjust the output voltage Vout. The LDO regulator 121 may stably provide a load current IL regardless of fluctuations of the load current IL. In other words, even if the load current IL changes from 20 mA to 200 mA, the output voltage Vout of 0.9 V may be stably maintained.

During a first period T1, the load current IL may be 20 mA, and the LDO regulator 121d may maintain the output voltage Vout of 0.9 V. Because the coarse loop circuit 310 outputs the first to fifth coarse code bits C_LPT[1] to C_LPT[5] each having a high state, the first to fifth PMOS transistors M_LP1 to M_LP5 of the coarse current driver 313 may all be turned off. The initialization signals INIT[3:1] provided from the digital controller 330 may have a previous value P/V, and the enable signal EN may have a high level. The fine loop circuit 320 may operate in response to the enable signal EN, and nine or ten PMOS transistors of the first to twentieth PMOS transistors M_SP1 to M_SP20 of the fine current driver 323 may be turned on. The fine loop circuit 320 may provide the fine current I_SPT of 20 mA.

During a second period T2, the load current IL may increase up to 200 mA. The output voltage Vout of the LDO regulator 121d may drop to lower than 0.9 V. The fine loop circuit 320 may be turned off, and the coarse loop circuit 310 may be turned on. As the output voltage Vout decreases, the input voltage Vin that is provided to the coarse loop circuit 310 and the fine loop circuit 320 may decrease. When the input voltage Vin decreases, as described with reference to FIGS. 7 and 8, the first to fifth coarse code bits C_LPT[1] to C_LPT[5] of the current mirror flash ADC 312 may be changed.

For example, the first coarse code bit C_LPT[1] may be set to "0". As the output voltage Vout decreases, the second to fourth coarse code bits C_LPT[2] to C_LPT[4] may be sequentially set to "0". When the first coarse code bit C_LPT[1] is set to "0", the first PMOS transistor M_LP1 may be turned on, and thus, the coarse current I_LPT of 40 mA may be supplied. Then, when the second coarse code bit C_LPT[2] is set to "0", the second PMOS transistor M_LP2 may be turned on. In this case, the coarse current I_LPT of 40 mA may be further supplied. Accordingly, when the third and fourth coarse code bits C_LPT[3] and C_LPT[4] are sequentially set to "0", the third and fourth PMOS transistors M_LP3 and M_LP4 may be sequentially turned on. In this case, the coarse current I_LPT may further increase.

In addition, the initialization signals INIT[3:1] provided from the digital controller 330 may be set to "000" on the basis of the first coarse code bit C_LPT[1], and thus, the enable signal EN may transition to a low level. In this case, the fine loop circuit 320 may be turned off.

During a third period T3, each of the first to fourth coarse code bits C_LPT[1] to C_LPT[4] of the coarse loop circuit 310 may remain at a low level, and the fifth coarse code bit C_LPT[5] may toggle. As the fifth coarse code bit C_LPT[5] toggles, the load current IL may vary between 160 mA and 200 mA. As the load current IL varies, the output voltage Vout may change within the large voltage range. In addition, in the third period T3, the digital controller 330 may generate a control signal for operating the fine loop circuit 320.

For example, the digital controller 330 may generate the reset signal RST to be provided to the shift register 322 of the fine loop circuit 320. The reset signal RST may be a signal for setting each of the fine code bits C_SPT[1] to C_SPT[20] of the shift register 322 to "1". When the reset signal RST is applied to the shift register 322, the fine current I_SPT may be 0 mA.

During a fourth period T4, the fifth coarse code bit C_LPT[5] may continue to toggle, and the digital controller 330 may generate the control signal for operating the fine loop circuit 320. For example, the digital controller 330 may generate the initialization signals INIT[3:1] to be provided to the shift register 322 of the fine loop circuit 320. The initialization signals INIT[3:1] may be used to set each of the fine code bits C_SPT[1] to C_SPT[20] of the shift register 322 to "0". For example, when the initialization signals INIT[3:1] (="111") are received to set each of the first to twentieth fine code bits C_SPT[1] to C_SPT[20], the fine current I_SPT may be set to "20 mA".

During a fifth period T5, the digital controller 330 may generate the enable signal EN on the basis of the fifth coarse code bit C_LPT[5]. When the enable signal EN goes to a high level, the coarse loop circuit 310 may maintain the same state. In this case, the fine loop circuit 320 may start to operate. For example, because each of the first to fifth coarse code bits C_LPT[1] to C_LPT[5] has a value of "0", the coarse loop circuit 310 may supply the coarse current I_LPT of 160 mA. The fine loop circuit 320 may operate in response to the enable signal EN. Because each of the first to twentieth fine code bits C_SPT[1] to C_SPT[20] is set to "0", the fine loop circuit 320 may supply the fine current I_SPT of 40 mA.

The LDO regulator 121d according to an exemplary embodiment of the inventive concept may adjust the output voltage Vout within the large voltage range by using the coarse loop circuit 310 and may finely adjust the output voltage Vout by using the fine loop circuit 320. The output voltage Vout may be adjusted quickly and accurately by the LDO regulator 121d according to an embodiment of the inventive concept.

FIG. 15 is a flowchart for describing an operation method of the LDO regulator of FIG. 14A according to an exemplary embodiment of the inventive concept. Referring to FIGS. 14A and 15, the LDO regulator 121d may include the coarse loop circuit 310, the fine loop circuit 320, and the digital controller 330.

The coarse current driver 313 of the coarse loop circuit 310 may include the first to fifth PMOS transistors M_LP1 to M_LP5. Each of the first to fifth PMOS transistors M_LP1 to M_LP5 may supply a current of 40 mA. The fine current driver 323 of the fine loop circuit 320 may include the first to twentieth PMOS transistors M_SP1 to M_SP20. Each of the first to twentieth PMOS transistors M_SP1 to M_SP20 may supply a current of 2 mA. The LDO regulator 121d may stably provide a load current IL regardless fluctuations of the load current IL.

Step S110 may be a steady state. In step S110, the fine loop circuit 320 may provide the load current IL of 20 mA. The LDO regulator 121 may maintain the output voltage of 0.9 V. Ten PMOS transistors of the first to twentieth PMOS transistors M_SP1 to M_SP20 of the fine current driver 323 may be turned on.

Step S120 may be a load transition state in which the load current IL temporarily increases. In step S120, the fine loop circuit 320 may be turned off. The coarse loop circuit 310 may remain at a turn-on state. When the load current IL increases up to 200 mA, the output voltage Vout of the LDO regulator 121d may become lower than 0.9 V. As the output voltage Vout decreases, the input voltage Vin that is provided to the coarse loop circuit 310 may decrease. As the input voltage Vin decreases, the first to fifth coarse code bits C_LPT[1] to C_LPT[5] may be sequentially set to "0". In this case, the coarse current I_LPT may increase toward 200 mA.

Step S130 may be a load setting state in which the output voltage Vout is adjusted. In step S130, the digital controller 330 may change control signals for operating the fine loop circuit 320. The digital controller 330 may generate the reset signal RST to be provided to the shift register 322 of the fine loop circuit 320. When the reset signal RST is applied to the shift register 322, the fine current I_SPT may be 0 mA. Furthermore, since the fifth coarse code bit C_LPT[5] toggles in this step, i.e., S130, the load current IL may vary between 160 mA and 200 mA. As the load current IL varies, the output voltage Vout may change to the large voltage range.

Step S140 may be a load setting state in which the output voltage Vout is finely adjusted. In step S140, the digital controller 330 may generate the enable signal EN on the basis of the first coarse code bit C_LPT[5]. When the enable signal EN goes to a high level, the coarse loop circuit 310 may maintain the same state. In this case, the fine loop circuit 320 may start to operate. The coarse loop circuit 310 may supply the coarse current I_LPT of 160 mA. The fine loop circuit 320 may supply the fine current I_SPT of 40 mA in response to the enable signal EN.

Step S150 may be a steady state in which the load current IL goes to 200 mA.

Figure 14B:
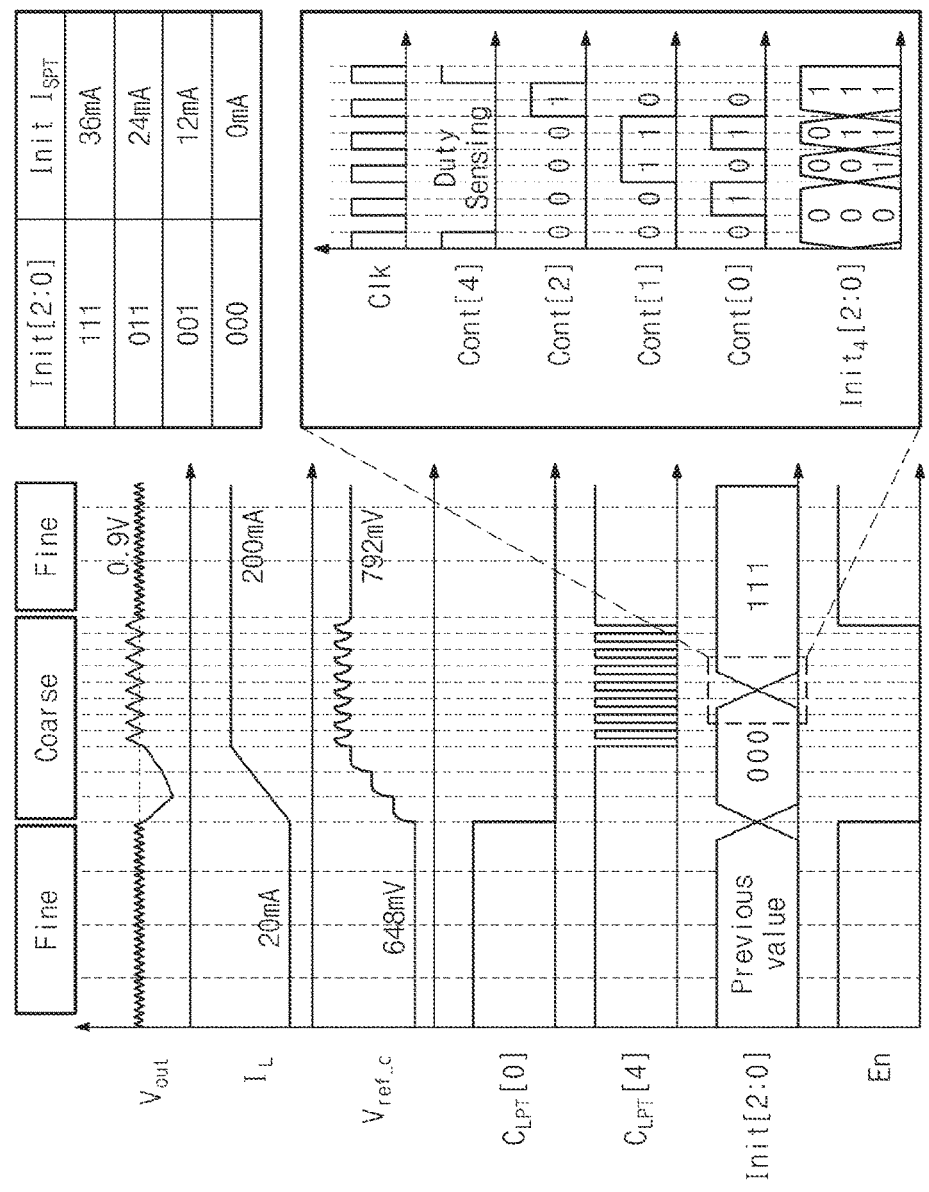
FIG. 14B is a drawing for describing an operation method of the LDO regulator of FIG. 2 in more detail according to an exemplary embodiment of the inventive concept.

FIG. 14B is a drawing for describing an operation method of the LDO regulator of FIG. 2 in more detail according to an exemplary embodiment of the inventive concept. Certain timing elements shown in FIG. 14B are the same as or similar to those shown in FIG. 14A. Accordingly, any repetitive description of overlapping elements may be omitted.

During a first Fine period in FIG. 14B, the load current IL may be 20 mA, and the LDO regulator 121d may maintain the output voltage Vout of 0.9 V. Because the coarse loop circuit 310 outputs the first to fifth coarse code bits C_LPT[0] to C_LPT[4] each having a high state, the first to fifth PMOS transistors M_LP1 to M_LP5 of the coarse current driver 313 may all be turned off. The initialization signals INIT[2:0] provided from the digital controller 330 may have a previous value, and the enable signal EN may have a high level. The fine loop circuit 320 may operate in response to the enable signal EN, and nine or ten PMOS transistors of the first to twentieth PMOS transistors M_SP1 to M_SP20 of the fine current driver 323 may be turned on. The fine loop circuit 320 may provide the fine current I_SPT of 20 mA. Also during the figure Fine period, the coarse reference voltage Vref_c may be 648 mV.

After the first Fine period, a Coarse period takes place. Certain portions of the Coarse period correspond to periods T2-T4 of FIG. 14A. For example, in the Coarse period, the enable signal EN, the first to fifth coarse code bits C_LPT[0] to C_LPT[4], the initialization signals INIT[2:0], and the load current IL are shown to behave the same as those in FIG. 14A. However, in FIG. 14B, after the output voltage Vout decreases in the Coarse period, it may vary within a large voltage range over 0.9V. For example, the output voltage Vout of the Coarse period increases in correspondence with the increase of the coarse reference voltage Vref_c in the Coarse period.

Further shown in FIG. 14B are signal diagrams of the clock signal CLK, the fifth coarse code bit C_LPT[4], outputs Cont[2:0] of the 3-bit counter 345 and the initialization signal Init4[2:0] during the transition period of the initialization signals INIT[2:0] in the Coarse period. Moreover, a table showing current values corresponding to the initialization signals INIT[2:0] is provided.

After the Coarse period, a second Fine period takes place in FIG. 14B. The second Fine period may correspond to the fifth period T5 of FIG. 14A. For example, the enable signal EN goes high, the load current IL may be maintained at 200 mA and the initialization signals INIT[2:0] are all high. In addition, the coarse reference voltage Vref_c may be maintained at 792 mV.

An LDO regulator according to an exemplary embodiment of the inventive concept may adjust the output voltage within a large voltage range by using a coarse loop circuit and may finely adjust the output voltage by using a fine loop circuit. The output voltage Vout may be adjusted quickly and accurately by the LDO regulator according to an exemplary embodiment of the inventive concept.

As described above, the LDO regulator according to an exemplary embodiment of the inventive concept may receive a power supply voltage VDD and may adjust the output voltage Vout. The LDO regulator according to an exemplary embodiment of the inventive concept may stably provide the output voltage Vout regardless of fluctuations of the load current IL.

While the inventive concept have been particularly shown and described with reference to exemplary embodiments thereof, it will be apparent to those skilled in the art that various changes and modifications may be made thereto without departing from the spirit and scope of the inventive concept as defined by the following claims.

What is claimed is:

1. A low dropout voltage (LDO) regulator, comprising:
a coarse loop circuit configured to receive an input voltage, generate a coarse code and adjust a coarse current according to the coarse code;
a digital controller configured to receive the coarse code and generate a fine loop control signal according to the coarse code; and
a fine loop circuit configured to receive the input voltage and the fine loop control signal and adjust a fine current according to the input voltage and the fine loop control signal,
wherein the coarse current and the fine current adjust a level of an output voltage,
wherein the coarse loop circuit has a current mirror circuit including MOS transistors, wherein the coarse loop circuit comprises:
a reference voltage changer configured to receive the coarse code and change a coarse reference voltage according to the coarse code;
an analog-to-digital converter (ADC) configured to receive the coarse reference voltage and the input voltage and generate the coarse code according to the coarse reference voltage and the input voltage; and
a coarse current driver configured to receive the coarse code and generate the coarse current according to the coarse code.

2. The LDO of claim 1, further comprising a voltage divider configured to receive the output voltage to generate the input voltage.

3. The LDO of claim 1, wherein the level of the output voltage is maintained in a steady state when the coarse loop circuit and the fine loop circuit operate at the same time.

4. The LDO of claim 1, wherein the reference voltage generator is configured to increase the coarse reference voltage when a load current increases and decrease the coarse reference voltage when the load current decreases.

5. The LDO of claim 1, wherein the reference voltage generator is configured to maintain a difference between the input voltage and the coarse reference voltage.

6. The LDO of claim 1, wherein the coarse code includes a plurality of bits, wherein each bit is configured to turn on or off a corresponding transistor of the coarse current driver.

7. The LDO of claim 1, wherein the ADC comprises the current mirror circuit and a comparator circuit configured to compare the input voltage with the coarse reference voltage, generate first and second currents according to the comparison result and provide the second current to a first node, wherein the current minor circuit includes:
a first current mirror circuit configured to generate a third current that mirrors the first current and provide the third current to a second node; and
a second current mirror circuit configured to generate a bit of the coarse code according to a current difference between the first and second nodes.

8. The LDO of claim 7, wherein the second current mirror circuit includes the MOS transistors, the MOS transistors including: a plurality of PMOS transistors and a plurality of corresponding NMOS transistors, wherein when a current value at a node of an NMOS transistor is greater than a current value at a node of a corresponding PMOS transistor, a bit value of the coarse code is a first level, and when the current value at the node of the NMOS transistor is less than the current value at the node of the corresponding PMOS transistor, the bit value of the coarse code is a second level.

9. The LDO of claim 8, wherein when the first level is 0 the second level is 1, and when the first level is 1 the second level is 0.

10. The LDO of claim 1, wherein the fine loop circuit comprises:
a comparator configured to compare the input voltage with a reference voltage and output a comparison result;
a shift register configured to receive the comparison result and the fine loop control signal and generate a fine code according to the comparison result and fine loop control signal; and
a fine current driver configured to generate the fine current according to the fine loop control signal.

11. The LDO of claim 10, wherein the fine code includes a plurality of bits, each bit configured to turn on or off a corresponding transistor of the fine current driver.

12. The LDO of claim 10, wherein the fine loop control signal includes an enable signal for activating the shift register, a disable signal for disabling the shift register and an initialization signal for determining an initial fine current.

13. The LDO of claim 12, wherein the digital controller includes a plurality of control units and a logic gate, wherein each of the control units is configured to receive a corresponding bit of the coarse code and generate a plurality of control signals, and wherein the logic gate is configured to generate the fine loop control signal according to the plurality of control signals output from each of the control units.

14. The LDO of claim 13, wherein the logic gate includes an OR gate.

15. The LDO of claim 13, wherein a first control unit of the control units comprises:
an enable fine loop controller including a 4-bit counter and a rising edge detector, the 4-bit counter is configured to receive a first bit of the coarse code and provide a first output value to the rising edge detector and provide a fourth output value as a first enable signal, and the rising edge detector is configured to detect a rising edge of the first output value and output a first disable signal; and
an initial fine current selector including a 3-bit counter and a logic circuit, the 3-bit counter is configured to receive a third output value of the 4-bit counter and generate a 3-bit output, and the logic circuit is configured to receive the 3-bit output and generate first initialization signals.

16. A low dropout voltage (LDO) regulator, comprising:
an output voltage node;
a voltage divider connected to the output voltage node and configured to receive an output voltage that is adjusted in response to a fine current and a coarse current, and to divide the output voltage to generate an input voltage;
a coarse loop circuit configured to generate a coarse code in response to the input voltage and generate the coarse current in response to the coarse code;
a fine loop circuit configured to generate a fine code in response to the input voltage and a plurality of fine control signals and to generate the fine current in response to the fine code; and
a digital controller configured to generate the plurality of fine control signals in response to the coarse code,
wherein the coarse loop circuit has a current mirror circuit including MOS transistors,
wherein the coarse loop circuit includes a reference voltage changer that maintains a coarse reference voltage when the output voltage is decreased at a first time, increases the coarse reference voltage when the output voltage is decreased at a second time, increases the coarse reference voltage when the output voltage increases at a third time, and maintains a difference between the coarse reference voltage and the output voltage at a fourth time.

17. The LDO of claim 16, wherein the coarse loop circuit includes a plurality of PMOS transistors to supply the coarse current.

18. The LDO of claim 16, wherein the fine loop circuit includes a plurality of MOS transistors to supply the fine current.

19. The LDO of claim 16, wherein the plurality of fine control signals include an enable signal for activating the fine loop circuit, a disable signal for deactivating the fine loop circuit and an initialization code for determining an initial fine current.

20. The LDO of claim 16, wherein the fine control signals are input to a shift register of the fine loop circuit.

21. The LDO of claim 20, wherein the shifter register generates the fine code according to the fine control signals.

22. The LDO of claim 21, wherein the shift register is an n-bit shift register and the fine code is n-bit code, wherein n is a number of fine loop drivers in the tine loop circuit.

23. The LDO of claim 16, wherein one current driver is on at the first time and a plurality of current drivers are on at the second time.

24. The LDO of claim 16, wherein the coarse loop circuit includes an analog-to-digital converter (ADC) that changes the coarse code based on a difference between the coarse reference voltage and the input voltage.

25. The LDO of claim 16, wherein the coarse code is an m-bit code, wherein m is a number of coarse drivers in the coarse loop circuit.

26. The LDO of claim 24, wherein the ADC includes the current mirror circuit and is a current mirror flash ADC.

27. The LIDO of claim 16, wherein the output voltage node is connected to a component in an application processor.

28. A low dropout voltage (LDO) regulator, comprising:
a line loop circuit configured to provide a fine loop current to an output voltage node and to be disabled in response to a disable signal when an output voltage at the output voltage node changes;
a coarse loop circuit configured to provide a varied coarse current in response to a toggling coarse code bit when the fine loop circuit is disabled; and
a digital controller configured to generate an initialization signal to set an initial fine current at a first level while the coarse current is being varied and to provide an enable signal to the fine loop circuit to activate the fine loop circuit when the coarse current enters a steady state.

* * * * *